United States Patent
Merrell et al.

(10) Patent No.: US 11,874,184 B2
(45) Date of Patent: *Jan. 16, 2024

(54) COMPOSITE CONDUCTIVE FOAM

(71) Applicant: Nano Composite Products, Inc., Orem, UT (US)

(72) Inventors: Aaron Jake Merrell, Orem, UT (US); David T. Fullwood, Provo, UT (US); Anton E. Bowden, Lindon, UT (US); Taylor D. Remington, Provo, UT (US)

(73) Assignee: Nano Composite Products, Inc., Orem, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/662,607

(22) Filed: May 9, 2022

(65) Prior Publication Data

US 2022/0276103 A1 Sep. 1, 2022

Related U.S. Application Data

(63) Continuation of application No. 15/929,713, filed on May 18, 2020, now Pat. No. 11,329,212, which is a
(Continued)

(51) Int. Cl.
*H01L 41/18* (2006.01)
*G01L 5/00* (2006.01)
(Continued)

(52) U.S. Cl.
CPC .............. *G01L 1/04* (2013.01); *G01L 1/06* (2013.01); *G01L 1/16* (2013.01); *G01L 1/18* (2013.01);
(Continued)

(58) Field of Classification Search
CPC ..... G01L 1/16; G01L 1/18; G01L 1/20; G01L 5/0052; Y10T 29/49117; H01L 41/183; H01L 41/37
See application file for complete search history.

(56) References Cited

U.S. PATENT DOCUMENTS 3,321,592 A 5/1967 Miller
3,748,373 A 7/1973 Remy
(Continued)

FOREIGN PATENT DOCUMENTS

CN 200994779 Y 12/2007
CN 101219050 A 7/2008
(Continued)

OTHER PUBLICATIONS

Yao, et al., "Wearable multifunctional sensors using printed stretchable conductors made of silver nanowires", @ The Royal Society of Chemistry, Dec. 5, 2013, 8 pages.
(Continued)

*Primary Examiner* — Andre J Allen
(74) *Attorney, Agent, or Firm* — Brake Hughes Bellermann LLP

(57) ABSTRACT

In one general aspect, a composite foam comprises a non-layered mixture of a polymeric foam with a plurality of voids; and a plurality of conductive fillers disposed in the polymeric foam. The conductive fillers are disposed in an even manner from outer surface to outer surface. In some implementations, the conductive fillers are up to 25% by weight of the composite foam. In some implementations, the composite foam may be used as padding. In some implementations, the composite foam may be used as a strain gauge. In some implementations, the foam may be in contact with a voltage detector.

20 Claims, 16 Drawing Sheets

Related U.S. Application Data continuation of application No. 16/384,609, filed on Apr. 15, 2019, now Pat. No. 10,658,567, which is a continuation of application No. 15/229,662, filed on Aug. 5, 2016, now Pat. No. 10,260,968, and a continuation of application No. 14/213,539, filed on Mar. 14, 2014, now Pat. No. 10,263,174, said application No. 15/229,662 is a continuation-in-part of application No. 14/213,539, filed on Mar. 14, 2014, now Pat. No. 10,263,174.

(60) Provisional application No. 61/961,970, filed on Oct. 28, 2013, provisional application No. 61/960,489, filed on Sep. 19, 2013, provisional application No. 61/956,394, filed on Jun. 8, 2013, provisional application No. 61/789,730, filed on Mar. 15, 2013.

(51) Int. Cl.
| | |
|---|---|
| *G01L 1/20* | (2006.01) |
| *G01L 1/16* | (2006.01) |
| *H01L 41/37* | (2013.01) |
| *G01L 1/18* | (2006.01) |
| *G01L 1/04* | (2006.01) |
| *G01L 1/06* | (2006.01) |
| *H10N 30/092* | (2023.01) |
| *H10N 30/85* | (2023.01) |

(52) U.S. Cl.
CPC .............. *G01L 1/20* (2013.01); *G01L 5/0052* (2013.01); *H10N 30/092* (2023.02); *H10N 30/852* (2023.02); *Y10T 29/49117* (2015.01)

(56) References Cited

U.S. PATENT DOCUMENTS

| | | | |
|---|---|---|---|
| 3,794,790 A | 2/1974 | Leyland |
| 4,060,705 A | 11/1977 | Peachey |
| 4,144,877 A | 3/1979 | Frei et al. |
| 4,172,216 A | 10/1979 | O'Shea |
| 4,258,100 A | 3/1981 | Fujitani et al. |
| 4,624,796 A | 11/1986 | Giniewicz et al. |
| 4,664,971 A | 5/1987 | Soens |
| 4,762,970 A | 8/1988 | Brinsley |
| 4,771,394 A | 9/1988 | Cavanagh |
| 4,777,346 A | 10/1988 | Swanton, Jr. |
| 4,808,336 A | 2/1989 | Rubner et al. |
| 4,951,985 A | 8/1990 | Pong et al. |
| 5,060,527 A | 10/1991 | Burgess |
| 5,132,583 A | 7/1992 | Chang |
| 5,323,650 A | 6/1994 | Fullen et al. |
| 5,373,651 A | 12/1994 | Wood |
| 5,441,301 A | 8/1995 | Breed et al. |
| 5,449,002 A | 9/1995 | Goldman |
| 5,510,812 A | 4/1996 | O'Mara et al. |
| 5,540,996 A | 7/1996 | Tanzilli et al. |
| 5,568,659 A | 10/1996 | Fogel |
| 5,592,759 A | 1/1997 | Cox |
| 5,637,389 A | 6/1997 | Colvin et al. |
| 5,695,859 A | 12/1997 | Burgess |
| 5,702,629 A | 12/1997 | Cui et al. |
| 5,775,715 A | 7/1998 | Vandergrift |
| 5,855,818 A | 1/1999 | Gan et al. |
| 5,856,644 A | 1/1999 | Burgess |
| 5,951,908 A | 9/1999 | Cui et al. |
| 6,033,370 A | 3/2000 | Reinbold et al. |
| 6,121,869 A | 9/2000 | Burgess |
| 6,126,874 A | 10/2000 | Dillon et al. |
| 6,265,466 B1 | 7/2001 | Glatkowski et al. |
| 6,360,597 B1 | 3/2002 | Hubbard, Jr. |
| 6,430,843 B1 | 8/2002 | Potter et al. |
| 6,485,432 B1 | 11/2002 | Stasz et al. |
| 6,506,153 B1 | 1/2003 | Littek et al. |
| 6,529,122 B1 | 3/2003 | Magnussen et al. |
| 6,534,430 B2 | 3/2003 | Makino et al. |
| 6,555,767 B1 | 4/2003 | Lockery et al. |
| 6,724,195 B2 | 4/2004 | Lurtz |
| 6,780,505 B1 | 8/2004 | Klett et al. |
| 6,925,851 B2 | 8/2005 | Reinbold et al. |
| 6,978,684 B2 | 12/2005 | Nurse |
| 7,059,028 B2 | 6/2006 | Lammer |
| 7,059,197 B2 | 6/2006 | Son et al. |
| 7,147,214 B2 | 12/2006 | Klett et al. |
| 7,225,565 B2 | 6/2007 | DiBenedetto et al. |
| 7,426,873 B1 | 9/2008 | Kholwadwala et al. |
| 7,443,082 B2 | 10/2008 | Grumm |
| 7,479,878 B2 | 1/2009 | Maki et al. |
| 7,506,460 B2 | 3/2009 | DiBenedetto et al. |
| 7,509,835 B2 | 3/2009 | Beck |
| 7,587,937 B2 | 9/2009 | Haselhurst et al. |
| 7,695,647 B2 | 4/2010 | Smela et al. |
| 7,854,173 B2 | 12/2010 | Cheng et al. |
| 7,935,415 B1 | 5/2011 | Hansen et al. |
| 7,947,773 B2 | 5/2011 | Hansen et al. |
| 7,997,125 B2 | 8/2011 | Kaya et al. |
| 8,210,994 B2 | 7/2012 | Chang et al. |
| 8,305,358 B2 | 11/2012 | Klinghult et al. |
| 8,361,608 B1 | 1/2013 | Hansen et al. |
| 8,371,174 B2 | 2/2013 | Chen et al. |
| 8,544,337 B2 | 10/2013 | Kuczynski et al. |
| 8,628,485 B2 | 1/2014 | Wilson et al. |
| 8,631,703 B2 | 1/2014 | Nagai et al. |
| 8,669,755 B2 | 3/2014 | Kato et al. |
| 8,758,892 B2 | 6/2014 | Bergin et al. |
| 8,850,897 B2 | 10/2014 | Eichhorn et al. |
| 8,904,877 B2 | 12/2014 | Burke et al. |
| 8,984,954 B2 | 3/2015 | Merrell et al. |
| 9,044,593 B2 | 6/2015 | Li et al. |
| 9,099,224 B2 | 8/2015 | Choi et al. |
| 9,192,816 B2 | 11/2015 | Molyneux et al. |
| 9,279,734 B2 | 3/2016 | Walker |
| 10,070,680 B2 | 9/2018 | Molyneux et al. |
| 10,405,779 B2 | 9/2019 | Merrell et al. |
| 2002/0198069 A1 | 12/2002 | Snyder et al. |
| 2003/0009308 A1 | 1/2003 | Kirtley |
| 2003/0194544 A1 | 10/2003 | Tobita et al. |
| 2003/0213939 A1 | 11/2003 | Narayan et al. |
| 2005/0044751 A1 | 3/2005 | Alaimo et al. |
| 2005/0101719 A1 | 5/2005 | Ishihara |
| 2005/0124864 A1 | 6/2005 | Mack et al. |
| 2005/0174243 A1 | 8/2005 | Musil |
| 2005/0258717 A1 | 11/2005 | Mullen |
| 2006/0260058 A1 | 11/2006 | Schmidt |
| 2006/0272429 A1 | 12/2006 | Ganapathi et al. |
| 2007/0056081 A1 | 3/2007 | Aspray |
| 2007/0068244 A1 | 3/2007 | Billing et al. |
| 2007/0084293 A1 | 4/2007 | Kaiserman et al. |
| 2007/0135878 A1 | 6/2007 | Lachenbruch et al. |
| 2007/0157488 A1 | 7/2007 | Guzman |
| 2008/0066564 A1 | 3/2008 | Hayakawa et al. |
| 2008/0067618 A1 | 3/2008 | Wang et al. |
| 2008/0067619 A1 | 3/2008 | Farahani et al. |
| 2008/0277631 A1 | 11/2008 | Smela et al. |
| 2009/0165569 A1 | 7/2009 | Taya et al. |
| 2009/0226696 A1 | 9/2009 | Simpson |
| 2009/0240171 A1 | 9/2009 | Morris Bamberg et al. |
| 2009/0288259 A1 | 11/2009 | Lean et al. |
| 2009/0302714 A1 | 12/2009 | Kim |
| 2010/0014556 A1 | 1/2010 | Huynh |
| 2010/0063779 A1 | 3/2010 | Schrock et al. |
| 2010/0126273 A1 | 5/2010 | Lim et al. |
| 2010/0271174 A1 | 10/2010 | Kaminska et al. |
| 2010/0305478 A1 | 12/2010 | Ordway et al. |
| 2010/0324698 A1 | 12/2010 | Sverrisson et al. |
| 2011/0054358 A1 | 3/2011 | Kim et al. |
| 2011/0054359 A1 | 3/2011 | Sazonov et al. |
| 2011/0192049 A1 | 8/2011 | Auger et al. |
| 2011/0192564 A1 | 8/2011 | Mommer et al. |
| 2011/0214501 A1 | 9/2011 | Ross et al. |
| 2011/0226066 A1 | 9/2011 | Anand et al. |
| 2011/0265973 A1 | 11/2011 | Scalia, Jr. |
| 2012/0024061 A1 | 2/2012 | Chiang |

(56) References Cited

U.S. PATENT DOCUMENTS

| | | |
|---|---|---|
| 2012/0036939 A1 | 2/2012 | Jarjour et al. |
| 2012/0048528 A1 | 3/2012 | Bergin et al. |
| 2012/0055257 A1 | 3/2012 | Shaw-klein |
| 2012/0082950 A1 | 4/2012 | Li et al. |
| 2012/0166091 A1 | 6/2012 | Kim et al. |
| 2012/0193572 A1 | 8/2012 | Mackay |
| 2012/0234111 A1 | 9/2012 | Molyneux et al. |
| 2012/0289866 A1 | 11/2012 | Irby et al. |
| 2012/0291564 A1 | 11/2012 | Amos et al. |
| 2013/0026411 A1 | 1/2013 | Jenninger et al. |
| 2013/0074248 A1 | 3/2013 | Evans et al. |
| 2013/0079693 A1 | 3/2013 | Ranky et al. |
| 2013/0123665 A1 | 5/2013 | Mariani et al. |
| 2013/0130843 A1 | 5/2013 | Burroughs et al. |
| 2013/0224458 A1 | 8/2013 | Bolliou |
| 2014/0013862 A1 | 1/2014 | Lind |
| 2014/0039082 A1 | 2/2014 | Peterson et al. |
| 2014/0182063 A1 | 7/2014 | Crawford et al. |
| 2014/0183403 A1 | 7/2014 | Peterson et al. |
| 2014/0230563 A1 | 8/2014 | Huang |
| 2014/0260653 A1 | 9/2014 | Merrell et al. |
| 2014/0260677 A1 | 9/2014 | Dojan et al. |
| 2014/0338458 A1 | 11/2014 | Wang et al. |
| 2014/0350435 A1 | 11/2014 | Lam |
| 2015/0101417 A1 | 4/2015 | Carroll et al. |
| 2015/0177079 A1 | 6/2015 | Eichhorn et al. |
| 2015/0182844 A1 | 7/2015 | Jang |
| 2015/0283353 A1 | 10/2015 | Kohn et al. |
| 2015/0289594 A1 | 10/2015 | Rushbrook et al. |
| 2016/0011091 A1 | 1/2016 | Huang et al. |
| 2016/0021972 A1 | 1/2016 | Grelle et al. |
| 2016/0076954 A1 | 3/2016 | Bowden et al. |
| 2016/0166178 A1 | 6/2016 | Fuss et al. |
| 2016/0181506 A1 | 6/2016 | Sirbuly et al. |
| 2016/0192862 A1 | 7/2016 | Merrell et al. |
| 2017/0077838 A1 | 3/2017 | Wang et al. |
| 2017/0303637 A1 | 10/2017 | Orand et al. |

FOREIGN PATENT DOCUMENTS

| | | |
|---|---|---|
| CN | 101669683 A | 3/2010 |
| CN | 201846875 U | 6/2011 |
| CN | 102144056 A | 8/2011 |
| CN | 102175356 A | 9/2011 |
| CN | 202396563 U | 8/2012 |
| CN | 202635729 U | 1/2013 |
| CN | 103110235 A | 5/2013 |
| CN | 103142236 A | 6/2013 |
| CN | 103900741 A | 7/2014 |
| CN | 104138658 A | 11/2014 |
| CN | 203914881 U | 11/2014 |
| CN | 203934734 U | 11/2014 |
| CN | 204117311 U | 1/2015 |
| CN | 204582326 U | 8/2015 |
| DE | 2113900 A1 | 9/1972 |
| EP | 0522882 A2 | 1/1993 |
| EP | 0700270 A1 | 3/1996 |
| EP | 1265825 A2 | 12/2002 |
| EP | 2277691 A1 | 1/2011 |
| EP | 2330937 A2 | 6/2011 |
| EP | 2078477 B1 | 7/2011 |
| EP | 2523231 A1 | 11/2012 |
| EP | 2608287 A1 | 6/2013 |
| EP | 2848139 A1 | 3/2015 |
| JP | 50114281 U | 9/1975 |
| JP | S5318893 B2 | 6/1978 |
| JP | H05296861 A | 11/1993 |
| JP | 2002047370 A | 2/2002 |
| JP | 2002340700 A | 11/2002 |
| JP | 2002357487 A | 12/2002 |
| JP | 2003282983 A | 10/2003 |
| JP | 2006084354 A | 3/2006 |
| JP | 2006528366 A | 12/2006 |
| JP | 3968430 B2 | 8/2007 |
| JP | 2007533109 A | 11/2007 |
| JP | 4063564 B2 | 3/2008 |
| JP | 2008542691 A | 11/2008 |
| JP | 2008544218 A | 12/2008 |
| JP | 2009139329 A | 6/2009 |
| JP | 4565109 B2 | 10/2010 |
| JP | 2012164735 A | 8/2012 |
| JP | 5198608 B2 | 5/2013 |
| JP | 5981852 B2 | 8/2016 |
| KR | 1020100122002 A | 11/2010 |
| KR | 20120099938 A | 9/2012 |
| SU | 1713821 A1 | 2/1992 |
| WO | 89/10166 A1 | 11/1989 |
| WO | 98/29851 A1 | 7/1998 |
| WO | 00/13582 A1 | 3/2000 |
| WO | 2004/070336 A1 | 8/2004 |
| WO | 2005/117030 A2 | 12/2005 |
| WO | 2006/132463 A1 | 12/2006 |
| WO | 2009/089406 A2 | 7/2009 |
| WO | 2009/108334 A2 | 9/2009 |
| WO | 2010/091258 A1 | 8/2010 |
| WO | 2010/096691 A2 | 8/2010 |
| WO | 2010/131820 A1 | 11/2010 |
| WO | 2011/083611 A1 | 7/2011 |
| WO | 2012/007855 A1 | 1/2012 |
| WO | 2012/035350 A1 | 3/2012 |
| WO | 2012/098840 A1 | 7/2012 |
| WO | 2013/120398 A1 | 8/2013 |
| WO | 2014/008250 A1 | 1/2014 |
| WO | 2014/080429 A1 | 5/2014 |
| WO | 2015/003211 A1 | 1/2015 |

OTHER PUBLICATIONS

Zeng, et al., "Synthesis and Processing of PMMA Carbon Nanotube Nanocomposite Foams", Polymer 51.3, (2010), pp. 655-664.

Notice of Grant for Israel Application No. 240703, dated Jan. 29, 2020 with partial English translation, 3 pages.

Office Action for U.S. Appl. No. 15/150,049, dated Mar. 6, 2020, 15 pages.

Alonso, et al., "Short-fiber-reinforced Epoxy Foams", Composites Part A: Applied Science and Manufacturing, vol. 37, No. 11, 2006, pp. 1952-1960.

Bauer, "Piezo-, Pyro- and Ferroelectrets: Soft Transducer Materials for Electromechanical Energ Conversion," IEEE Transactions on Dielectrics and Electrical Insulation, vol. 13, No. 5, pp. 953-962, Oct. 2006.

Bonato, Paolo, "Wearable Sensors/Systems and Their Impact on Biomedical Engineering", IEEE Engineering in Medicine and Biology Magazine, May/Jun. 2003, pp. 18-20.

Calkins et al., "Applications for a Nano-Composite High Displacement Strain Gauge", 9 Pages, 2010.

Calkins, Thomas, "Nanocomposite High Displacement Strain Gauges for use in Human-Machine Interfaces: Applications in Hand Pose Determination", 2011, 97 pages.

Cannata, et al., "An Embedded Artificial Skin for Humanoid Robots", Proceedings of IEEE International Conference on Multisensor Fusion and Integration for Intelligent Systems Seoul, Korea, Aug. 2008, pp. 434-438.

Challagulla, et al., "Electromechanical Response of Piezoelectric Foams", Acta Materialia, vol. 60, No. 5, Mar. 2012, pp. 2111-2127.

Cheung, et al., "A novel fluidic strain sensor for large strain measurement", Sensors and Actuators A 147, (2008), pp. 401-408.

Ibeh, et al., "Current Trends in Nanocomposite Foams", Journal of Cellular Plastics 44.6, (2008), pp. 493-515.

Converse et al., "Quantification of Nickel Nanostrand Distributions within a Silicone Matrix using a FIB/SEM System", 2010, 15 pages.

Flandin, et al., "Effect of Strain on the Properties of an Ethylene-Octene Elastomer with Conductive Carbon Fillers", Journal of Applied Polymer Science, vol. 76, 2000, pp. 894-905.

Fleming, et al., "In Vivo Measurement of Ligament/Tendon Strains and Forces: A Review", Annals of Biomedical Engineering, vol. 32, No. 3, Mar. 2004, pp. 318-328.

Fullwood, et al., "Dispersion metrics for composites—a machine learning based analysis", SAMPE International. Long Beach, CA, (2013), 12 pages.

(56) References Cited

OTHER PUBLICATIONS

Gerhard-Malthaupt, "Less can be More: Holes in Polymers lead to a new Paradigm of Piezoelectric Materials for Electret Transducers", IEEE transactions on Diaelectrics and Electrical Insulation, vol. 9, No. 5, Oct. 2002, pp. 850-859.
Hampshire, et al., "Monitoring the Behavior of Steel Structures Using Distributed Optical Fiber Sensors", journal of Constructional Steel Research 53, (2000), pp. 267-281.
Han, et al., "Thermal Conductivity of Carbon Nanotubes and Their Polymer Nanocomposites: A Review"; Progress in Polymer Science 36 (2011), pp. 914-944.
Ma et al., "The effect of surface chemistry of graphene on cellular structures and electrical properties of polycarbonate nanocomposite foams", Industrial & Engineering Chemistry Research 53.12, (2014), pp. 4697-4703.
Hyatt, et al., "Nano-composite Sensors for Wide Range Measurement of Ligament Strain", 2010, 6 pages.
International Search Report and Written Opinion for PCT Application No. PCT/US2014/028984, dated Jun. 26, 2014, 13 pages.
Johnson et al., "Nanocomposite Large-Strain Sensor Optimization", 2009, 1 page.
Johnson, et al., "A Percolation/Quantum Tunneling Model for the Unique Behavior of Multifunctional Silicon/Nickel Nanostrand Nanocomposites", Society for the Advancement of Material and Process Engineering, 2010, 10 pages.
Johnson, et al., "Multiscale Model for the Extreme Piezoresistivity in Silicon/Nickel Nanostrand Nanocomposites", 2011, 11 pages.
Johnson, et al., "Optimization of Nickel Nanocomposite for Large Strain Sensing Applications", Sensors and Actuators A 166 (2011) pp. 40-47.
Johnson, et al., "The Colossal Piezoresistive Effect in Nickel Nanostrand Polymer Composites and a Quantum Tunneling Model", Tech Science Press, CMC, vol. 15, No. 2, 2010, pp. 87-111.
Kanda, Masae, "High Strain Electrostrictive Polymers: Elaboration Methods and Modelization", URL:https://tel.archives-ouvertes.fr/tel-00701539/document, May 25, 2012, 164 pages.
Dai et al., "Electrical Properties of an Ultralight Conductive Carbon Nanotube/Polymer Composite Foam Upon Compression", Polymer-Plastics Technology and Engineering 51.3, (2012), pp. 304-306.
Chen et al., "Polymer Nanocomposite Foams", Journal of Materials Chemistry A 1.12 (Published online Dec. 18, 2012), pp. 3837-3850.
Lindner, et al., "Dielectric Barrier Microdischarges: Mechanism for the Charging of Cellular Piezoelectric Polymers", Journal of Applied Physics, vol. 91, No. 8, Apr. 15, 2002, pp. 5283-5287.
Mahfuz, et al., "Fabrication, Synthesis and Mechanical Characterization of Nanoparticles Infused Polyurethane Foams", Composites Part A: Applied Science and Manufacturing, vol. 35, No. 4, 2004, pp. 453-460.
Merrell, et al., "Applications of nano-composite piezoelectric foam sensors", Proceedings of ASME conference on Smart Materials, Sep. 2013, 5 pages.
Koecher et al., "Characterization of Nickel Nanostrand Nanocomposites through Dielectric Spectroscopy and Nanoindentation", Polymer Engineering & Science, Apr. 2, 2013, pp. 2666-2673.
Neugschwandtner, et al., "Large and Broadband Piezoelectricity in Smart Polymer-Foam Space-Charge Electrets", Applied Physics Letters, vol. 77, No. 23, Dec. 4, 2000, pp. 3827-3829.
Patel, Imran, "Ceramic Based Intelligent Piezoelectric Energy Harvesting Device", Ch. 8 of the book "Advances in Ceramics—Electric and Magnetic Ceramics, Bioceramics, Ceramics and Environement" published on Sep. 6, 2011, pp. 133-154, 23 pages.
Remington, et al., "Biomechanical Applications of Quantum Nano-Composite Strain Gauges", Brigham Young University, Provo, 2013, pp. 1-4.
Rizvi et al., "Characterization of a Porous Multifunctional Nanocomposite for Pressure Sensing", ASME 2012 Conference on Smart Materials, Adaptive Structures and Intelligent Systems, American Society of Mechanical Engineers, Abstract, 2012.
Saha, et al., "Effect of Nanoparticles on Mode-I Fracture Toughness of Polyurethane Foams", Polymer Composites, vol. 30, No. 8, 2009, pp. 1058-1064.
Brady et al., "Inherently Conducting Polymer Modified Polyurethane Smart Foam for Pressure Sensing", Sensors And Actuators A: Physical 119.2, (2005), pp. 398-404.
Shen, et al., "Mechanical Characterization of Short Fiber Reinforced Phenolic Foam", Composites Part A: Applied Science and Manufacturing, vol. 34, No. 9, 2003, pp. 899-906.
Patel et al., "Longitudinal Monitoring of Patients with Parkinson's Disease via Wearable Sensor Technology in the Home Setting", 33rd Annual International Conference of the IEEE EMBS Boston, Massachusetts USA, Aug. 30-Sep. 3, 2011, pp. 1552-1555.
Sun, et al., "Energy Absorption Capability of Nanocomposites: A Review", Composites Science and Technology, vol. 69, No. 14, 2009, pp. 2392-2409.
Taghavi et al., "A Novel Soft Metal-Polymer Composite for Multidirectional Pressure Energy Harvesting," Advanced Energy Materials, vol. 4, May 2, 2014, 6 pages.
Tao, et al., "Gait Analysis Using Wearable Sensors", Sensors 2012, 12, pp. 2255-2283.
Ventrelli, et al., "Development of a Stretchable Skin-Like Tactile Sensor Based on Polymeric Composites", Proceedings of the 2009 IEEE International Conference on Robotics and Biomimetics, Dec. 19-23, 2009, pp. 123-128.
Verdejo, et al., "Enhanced Acoustic Damping in Flexible Polyurethane Foams Filled With Carbon Nanotubes", Composites Science and Technology 69.10, (2009), pp. 1564-1569.
Verdejo, et al., "Physical Properties of Silicone Foams Filled with Carbon Nanotubes and Functionalized Graphene Sheets", European Polymer Journal 44.9, (2008), pp. 2790-2797.
Wang, "Piezoelectric Nanogenerators for Self-Powered Nanosensors and Nanosystems", Wiley Encyclopedia of Electrical and Electronics Engineering, 2012, 20 pages.
Watanabe, et al., "Tests of Wireless Wearable Sensor System in Joint Angle Measurement of Lower Limbs", 33rd Annual International Conference of the IEEE EMBS Boston, Massachusetts USA, Aug. 30-Sep. 3, 2011, pp. 5469-5472.
Wegener, M., "Piezoelectric polymer foams: transducer mechanism and preparation as well as touch-sensor and ultrasonic-transducer properties", Proceedings of SPIE, vol. 7644, 76441A, 2010, pp. 1-9.
Yan, et al., "Electrical Conductivity and Major Mechanical and Thermal Properties of Carbon Nanotube-filled Polyurethane Foams", Journal of Applied Polymer Science 120.5, (2011), pp. 3014-3019.
Yang, et al., "Conductive Carbon Nanofiber-polymer Foam Structures", Advanced Materials 17.16, (2005), pp. 1999-2003.

COMPOSITE CONDUCTIVE FOAM

CROSS REFERENCE TO RELATED APPLICATIONS

This application is a Continuation of, and claims priority to, U.S. application Ser. No. 15/929,713, filed May 18, 2020, which is a Continuation of, and claims priority to, U.S. application Ser. No. 16/384,609, filed Apr. 15, 2019. Application Ser. No. 16/384,609 is a continuation of U.S. application Ser. No. 14/213,539 filed Mar. 14, 2014, now U.S. Pat. No. 10,263,174, which is a Non-provisional of, and claims priority to, U.S. Provisional Application No. 61/789,730, filed on Mar. 15, 2013, U.S. Provisional Application No. 61/956,394, filed on Jun. 8, 2013, U.S. Provisional Application No. 61/960,489, filed on Sep. 19, 2013, and U.S. Provisional Application No. 61/961,970, filed Oct. 28, 2013. Application Ser. No. 16/384,609 is also a Continuation of, and claims priority to, Ser. No. 15/229,662, filed Aug. 5, 2016, now U.S. Pat. No. 10,260,968, which is a continuation-in-part of, and claims priority to, U.S. application Ser. No. 14/213,539, now U.S. Pat. No. 10,263,174, which claims priority to U.S. Provisional Application No. 61/789,730, filed on Mar. 15, 2013, U.S. Provisional Application No. 61/956,394, filed on Jun. 8, 2013, U.S. Provisional Application No. 61/960,489, filed on Sep. 19, 2013, and U.S. Provisional Application No. 61/961,970, filed Oct. 28, 2013. The disclosures of these earlier filed applications are all incorporated by reference herein in their entireties.

FEDERALLY SPONSORED RESEARCH

This application was made with support from a government grant under Grant Number CMMI-1235365 awarded by the National Science Foundation. The government has certain rights in this application.

TECHNICAL FIELD

This description relates to a uniform composite material that exhibit piezoelectric and/or piezoresistive properties in response to deformation and relaxation under both dynamic and quasi-static loading conditions.

BACKGROUND

Strain, impact energy, and force sensors can provide vital information for many mechanics and dynamics applications. Some strain gauges are piezoresistive, meaning that the electrical conductivity of the gauge changes under pressure. Such gauges require a current source, for example a battery, to operate. Other strain gauges are piezoelectric, meaning that the gauge generates electric potential, in the form of a voltage that can be measured, under strain. Existing strain gauges are limited in terms of the magnitude of strain they can measure, primarily limited to strain ranges of 1-2% strain. Additionally, many such gauges are expensive, and difficult to calibrate, limiting the use of such gauges to laboratory settings. Of additional concern is the phenomenon of drift, which is defined as change in the mathematics of the calibration function with respect to time and or amount of use.

SUMMARY

An elastomeric composite material is provided that can be used in a strain gauge measuring severity of impact and deformation via a piezoelectric response. The composite material includes an elastomeric polymer with voids and conductive fillers dispersed throughout. The composite material provides unexpected phenomena, piezoelectric response to deformation and a decrease in electrical resistance with increased strain. Both of these properties are valuable in sensing applications. A primary differentiator of the present material is that it exhibits a predictable and repeatable electromechanical response (piezoelectric and/or piezoresistive) at mechanical strains of up to 80% or more. Some compositions of the composite material do not suffer from drift. Because the composite material possesses mechanical properties similar to many commercial foams, the composite material can be substituted or embedded into existing commercial products without significantly changing the footprint of the product or the mechanical response properties of the product. Such a substitution or embedment adds sensing capabilities to existing products.

In one general aspect, an apparatus includes a uniform composite mixture of an elastomeric polymer with a plurality of voids and a plurality of conductive fillers disposed in the elastomeric polymer. The conductive fillers may include conductive nanoparticles and/or conductive stabilizers. In another general aspect, a method of making a strain sensor includes mixing a plurality of conductive nanoparticles with an elastomeric polymer to form a uniform composite material having voids, the uniform composite material producing a voltage in response to deformation. In another aspect, a method for measuring strain includes detecting, along a first axis, an electrical response generated in response to an impact to a uniform composite material that includes conductive fillers and voids disposed throughout an elastomeric polymer. The impact may be along a second axis different from the first axis. The method also includes determining a deformation of the impact based on the electrical response.

The details of one or more implementations are set forth in the accompanying drawings and the description below. Other features will be apparent from the description and drawings, and from the claims.

DETAILED DESCRIPTION

Figure 1A:
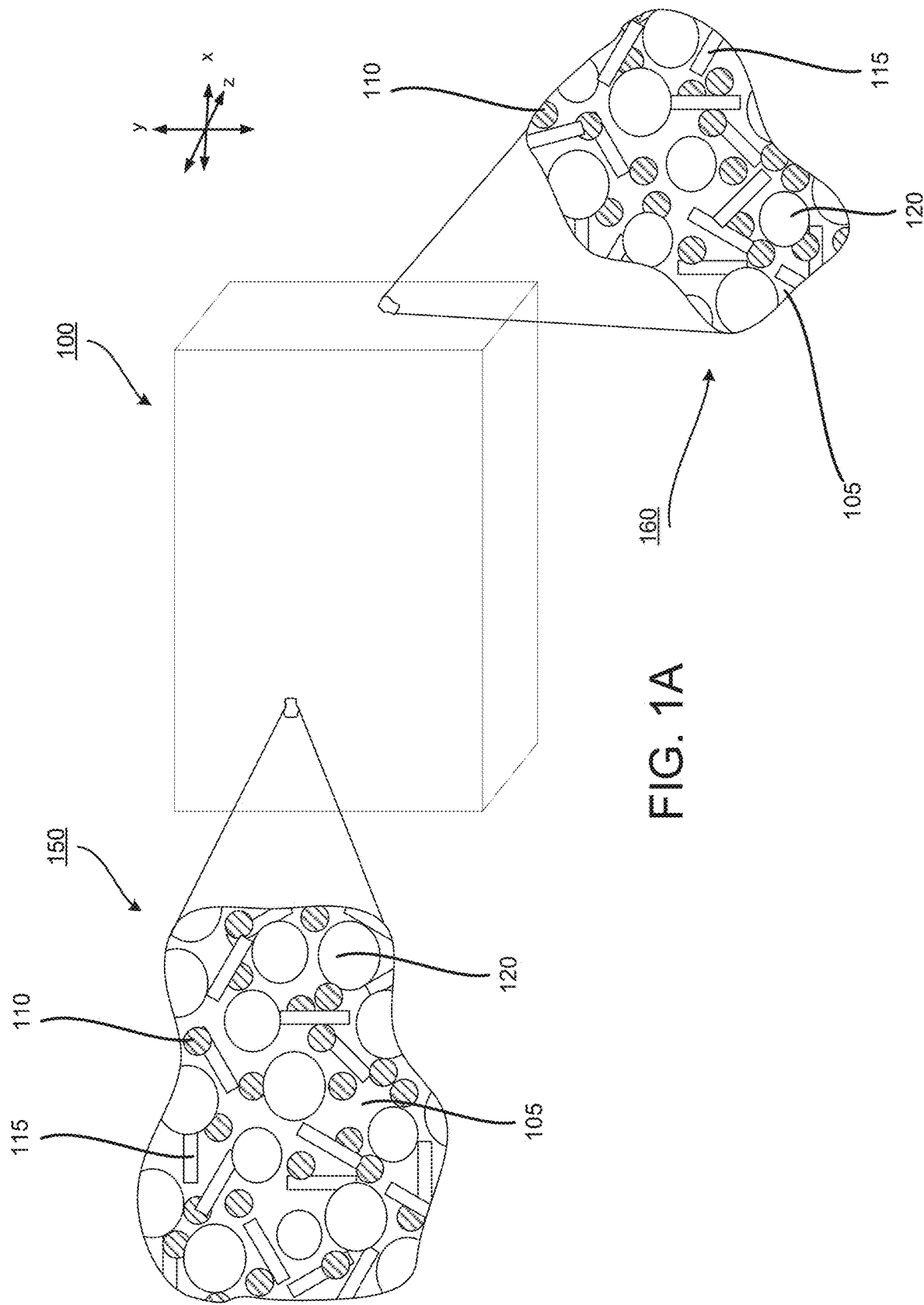
FIGS. 1A through 1C are high-level schematic diagrams of a uniform composite material that functions as a strain gauge, according to implementations.

In one general aspect, an apparatus includes a uniform composite material including a plurality of conductive nanoparticles disposed in an elastomeric polymer foam. The uniform composite material may produce a voltage in response to being deformed. The apparatus may also include at least one probe disposed in the uniform composite material and a voltage detector coupled to the probe. The apparatus may function as a strain gauge. The apparatus can include one or more of the following features. For example, the plurality of conductive nanoparticles may be a primary conductive filler and the uniform composite material may further include a secondary conductive filler. In some implementations, the elastomeric polymer foam is a polyurethane foam base. In some implementations, the uniform composite material further includes a fiber coated with a conductive substance, such as a carbon fiber coated with nickel. In some implementations, the plurality of conductive nanoparticles include at least one of nickel nanostrands, nickel powder, silver nanowires, and gold nanowires. As another example, the apparatus may also include a wireless controller operably coupled to the voltage detector and a computing device operably coupled to the wireless controller, the computing device configured to analyze data collected by the voltage detector. In some implementations, the voltage corresponds with a strain rate and deformation.

In another general aspect, an apparatus includes an elastomeric polymer, a plurality of conductive nanoparticles uniformly disposed within the elastomeric polymer, and a plurality of voids uniformly disposed within the elastomeric polymer. The apparatus produces an electrical response detectable along a first axis and a along a second axis orthogonal to the first axis when deformed. The apparatus may also include one or more of the following features. For example, the disposition of the plurality of conductive nanoparticles in the elastomeric polymer may define nano-junctions that produce the electrical response based on quantum tunneling. As another example, the apparatus may also include a probe disposed in the elastomeric polymer and a voltage detector coupled to the probe. In some implementations, the plurality of conductive nanoparticles are approximately one to twenty five percent by weight of the apparatus. In some implementations, the plurality of voids are up to 75% by volume of the apparatus and/or the plurality of voids may range up to 1000 μm. In some implementations the conductive nanoparticles are a primary conductive filler and the apparatus also includes a secondary conductive filler uniformly disposed within the elastomeric polymer.

In another general aspect, an apparatus includes a material including a non-layered mixture of an elastomeric polymer with a plurality of voids, a plurality of conductive nanoparticles, and a plurality of conductive stabilizers. The apparatus may include one or more of the following features, for example, the material may include a middle region having the conductive nanoparticles and the conductive stabilizers disposed therein, and the middle region may be uniform along a first axis and along a second axis orthogonal to the first axis. As another example, the material, when compressed, may cause a decrease in electrical resistance along a first axis and a decrease in electrical resistance along a second axis orthogonal to the first axis. In some implementations, the conductive nanoparticles are one to twenty five percent by weight of the material and the conductive stabilizers are one to twenty percent by weight of the material. In some implementations, increasing an amount of the plurality of conductive stabilizers up to seven percent by weight increases energy absorption of the material.

In another general aspect, an apparatus includes a uniform composite material including a non-layered mixture of an elastomeric polymer with a plurality of voids and a plurality of conductive fillers disposed in the elastomeric polymer. The apparatus may include one or more of the following features. For example, in some implementations, the plurality of conductive fillers includes a plurality of conductive nanoparticles. In some implementations the plurality of conductive fillers include tubes coated with a conductive substance and/or fibers coated with a conductive substance. The plurality of conductive fillers may include a combination of a plurality of conductively coated fibers and a plurality of conductive nanoparticles. In some implementations, the disposition of the plurality of conductive fillers in the elastomeric polymer may form a continuous conductive path through the apparatus. In some implementations, the disposition of the plurality of conductive fillers in the elastomeric polymer define nano-junctions that produce an electrical response to compression strain based on quantum tunneling. As another example, the apparatus may also include at least two probes disposed in the material, a current producing device, and a resistance detector coupled to the at least two probes. As another example, the apparatus may also include at least two probes disposed in the material, a voltage detector coupled to the at least two probes, and a memory operatively coupled to the voltage detector.

In another general aspect, a method of making a strain sensor includes mixing a plurality of conductive nanoparticles with an elastomeric polymer to form a uniform composite material having voids, the uniform composite material producing a voltage in response to deformation. The method can include one or more of the following features. For example, the method may also include curing the uniform composite material, operatively coupling the cured material to a voltage detector, and operatively coupling the voltage detector to a computing device. As another example, the method may include including at least one probe coupled to a conductive mesh in a mold and curing the uniform composite material in the mold, so that the uniform composite material at least partially surrounds the mesh on the at least one probe. In some implementations, the plurality of conductive nanoparticles represent one to twenty five percent by weight of the uniform composite material. In some implementations, the method may include mixing a plurality of conductive stabilizers with the elastomeric polymer prior to mixing the plurality of conductive nanoparticles with the elastomeric polymer. In some implementations, the method may include mixing a plurality of conductive stabilizers with the elastomeric polymer, the plurality of conductive stabilizers representing one to twenty five percent by weight. In some implementations, the method may also include mixing a plurality of fibers coated with a conductive substance with the elastomeric polymer. In some implementations, the method may include mixing a plurality of fibers coated with a conductive substance with the elastomeric polymer, the fibers having lengths in a range of approximately 0.1 to 1 millimeter. In some implementations, the method may include mixing a plurality of fibers coated with a conductive substance with the elastomeric polymer, the conductive substance being up to thirty-five percent by weight of the coated fibers.

As another example, the elastomeric polymer may include a first part and a second part and the method may also include mixing a first portion of the conductive nanoparticles with the first part of the elastomeric polymer, mixing a second portion of the conductive nanoparticles with the second part of the elastomeric polymer, and forming the voids as a result of combining the first part of the elastomeric polymer with the second part of the elastomeric polymer. In some such implementations, the first portion may be smaller than the second portion and/or proportional to the portion of the first part to the second part. As another example, the method may also include sculpting the uniform composite material into a shape determined by a consumer apparatus. In some implementations, the plurality of conductive nanoparticles are screened prior to mixing and/or curing the uniform composite material includes casting or molding the uniform composite material. In some implementations a shape of the uniform composite material is determined by a consumer apparatus and/or the uniform composite material functions as padding in a consumer apparatus, such as a helmet, an insole in a shoe, or a mattress.

As another example, the method may also include applying an impact with a known deformation to the uniform composite material, determining a voltage generated by the impact, and repeating the applying and determining with impacts having a different known deformation. As another example, the method may include cutting the uniform composite material in a first direction and in a second direction orthogonal to the first direction. In some implementations, the uniform composite material may be sprayed or painted on a substructure and/or at least partially cover an artificial limb.

In another aspect, a method for measuring deformation includes detecting, along a first axis, an electrical response generated in response to an impact to a uniform composite material that includes conductive fillers and voids disposed throughout an elastomeric polymer. The impact is along a second axis different from the first axis. The method also includes determining a deformation of the impact based on the electrical response.

The method may include one or more of the following features. For example, the method may also include determining a strain rate and deformation for the impact based on the electrical response. As another example, the method may include transmitting data representing the voltage to an external computing device and determining the deformation of the impact at the external computing device. As another example, the voltage may be a first electrical response and the method may also include detecting, along a third axis different from the first axis and the second axis, a second electrical response and determining a location of the impact based on the first electrical response and the second electrical response.

As another example, the uniform composite material may function as padding in a consumer apparatus and/or measure up to 80% strain without permanent deformation of the material. In some implementations, the electrical response is substantially the same after repeated detecting and determining and/or has a linear relationship with the deformation of the impact. In some implementations, the conductive material includes conductively coated fibers, which increase an energy absorption ability of the uniform composite material. In some implementations, the material may be applied to a portion of an artificial limb, and the method may also include providing feedback to a user about the deformation of the impact.

In another aspect a non-transitory computer-readable medium stores instructions that, when executed, cause a computing device to detect a voltage generated in response to an impact to a non-layered material that includes an elastomeric polymer foam, conductive nanoparticles, and conductive stabilizers, to store voltage data representing the voltage in a memory, and transmit the voltage data. The non-transitory computer-readable medium may include one or more of the following features. For example, the non-transitory computer-readable medium may further storing instructions that, when executed, cause the computing device to repeat the detecting and storing, generating a plurality of voltage data and transmit the plurality of voltage data to an external computing device in response to an instruction executed at the external computing device. As another example, the computer-readable medium may include instructions that cause the computing device to transmit the voltage data to an external computing device in response to an instruction executed at the external computing device. In another example, the computer-readable medium may further store instructions that, when executed, cause the computing device to transmit the voltage data in response to storing the voltage data in the memory.

In another aspect, a method of making a strain sensor includes mixing a plurality of conductive fillers with an uncured elastomeric polymer, forming voids in the mixture of the conductive fillers and the uncured elastomeric polymer, and curing the mixture with the voids to form the strain sensor, the strain sensor producing an electrical response in response to compression. In some implementations, the method may also include introducing the mixture of the conductive fillers and the uncured elastomeric polymer into a mold and adjusting a modulus of the strain sensor by controlling an amount of the mixture introduced into the mold to match a modulus of an existing elastomeric foam in an existing product. In some implementations, the strain sensor is used in place of the existing elastomeric foam in the existing product. In some implementations, the strain sensor is an original strain sensor and the method also includes cutting a plurality of strain sensors from the original strain sensor.

FIG. 1A is a high-level schematic diagram of a composite material 100 that exhibits a piezoelectric response and/or a negative piezoresistive effect to compression and relaxation, according to one implementation. The composite material 100 also exhibits a piezoelectric response and/or piezoresistivity in response to tensile strain. The composite material 100 may include several components: a matrix 105 with one or more conductive fillers (e.g., conductive nanoparticles 110, conductive stabilizers 115), and voids 120. The voids 120 and conductive fillers may be uniformly dispersed throughout the matrix. The matrix 105 may be any elastomeric polymer, such as a silicone-based material, a polyurethane material, other foam-like material, etc., that retains its shape after deformation and includes voids 120 throughout the material. In other words, the matrix 105 has elasticity, porosity, and high failure strain, typically from 50% to 1000% strain.

In some implementations, the elastomeric polymer matrix 105 may be a foam-based product that forms voids 120, for example through a chemical reaction, introduction of a foaming agent, through gas injection, etc. The voids 120 may give the composite material 100 relatively low weight, relatively low density, and relatively high energy absorption. In other words, unlike a solid material, in composite material 100 the voids 120 are dispersed throughout the matrix 105. For example, the density of the elastomeric polymer used for matrix 105 may be approximately two to three-and-a-half times greater without the voids than with the voids. For example, in some implementations the composite material 100 may have a density from 350 kg/m$^3$ to 800 kg/m$^3$.

The composite material 100 may also have porosity due to the voids 120. The porosity of the composite material 100 may be defined in terms of the volume fraction of air and the size of the voids 120. Each of these elements may be affected by several factors, including the elastomeric polymer used as the matrix 105, the process used to form the voids 120, confinement of the composite material 100 during formation of the voids and/or curing (e.g., size and shape of a mold and amount of composite material introduced into the mold), and the amount and type of the conductive fillers mixed with the elastomeric polymer, etc. For example, inclusion of conductive nanoparticles tend to decrease the size of the voids. Voids may be open-cell (e.g., the voids may run into or connect with each other) or closed-cell (e.g., the voids are separate from each other) and can vary in size depending on a number of factors. In some implementations the voids 120 may range in size up to 1000 μm.

In some implementations, the elastomeric polymer used as the matrix 105 may be capable of being mixed with conductive fillers prior to curing. For example, some elastomeric polymers may be thermoset, or irreversibly cured via heat, a chemical reaction, or irradiation. Prior to curing, conductive fillers may be combined with the uncured elastomeric polymer. For example, an elastomeric polymer cured via a chemical reaction, such as foam, may include two parts, the elastomeric polymer being formed when the two parts are mixed or combined. Once combined, the two parts chemically react, generating the air pockets or voids characteristic of foam, and harden. Conductive fillers may be mixed with one or both parts prior to combining. Some elastomeric polymers may be mixed with a foaming agent prior to curing. Such elastomeric polymers may be combined with conductive fillers prior to mixing with the foaming agent. Voids may be formed in the elastomeric polymer by gas injection, by whipping, etc. Some elastomeric polymers may be cured via heat. Thermoset elastomeric polymers may be cast, molded, sprayed or extruded after mixing and before they cure.

In some implementations, the conductive filler may include conductive nanoparticles 110. Conductive nanoparticles 110 are particles with at least one dimension that measures 1000 nanometers or less and that also made from a material that conducts electricity. Examples of such conductive materials include nickel, platinum, gold, silver, copper, etc. Examples of conductive nanoparticles include nanowires, powders, and nanostrands. One type of nanostrand that can be included is a nickel nanostrand (NiN). NiNs are available from Conductive Composites, LLC (Heber City, UT) and are described by U.S. Pat. No. 7,935,415 entitled "Electrically Conductive Composite Material" and U.S. Pat. No. 8,361,608, entitled "Electrically Conductive Nanocomposite Material," which are incorporated herein by reference.

The conductive filler may also include a plurality of conductive stabilizers 115. The conductive stabilizers 115 may also be added to the uncured elastomeric polymer prior to formation of the voids. The conductive stabilizers 115 may be any conductive material that acts as a stabilizer. In one implementation, the conductive stabilizers 115 may be fibers coated with a material that conducts electricity. For example, the conductive stabilizers 115 may be carbon fibers coated with pure nickel. In some implementations, the fibers may be coated approximately 20-40% by weight with the conductive material. The fibers may be cut to short lengths, for example from 0.1 to 1 mm. The fibers may have a diameter of up to 10 μm (e.g., 0.2 μm, 1 μm, 5 μm, 8 μm). In some implementations, the fibers may be hollow (e.g., tubes). In some implementations, the fibers may be nickel-coated carbon nanotubes (CNTs) or nickel-coated carbon fibers (NCCFs), which are also available from Conductive Composites, LLC. The conductive stabilizers 115 may increase the strength and energy absorption capabilities of the composite material 100. The conductive nanoparticles 110 may also increase the strength and energy absorption capabilities of the composite material 100, but typically to a lesser extent than the conductive stabilizers 115. In some implementations, the conductive nanoparticles 110 may be a primary conductive filler and the conductive stabilizers may be a secondary conductive filler.

Because the conductive fillers, for example conductive nanoparticles 110 and/or the conductive stabilizers 115, are mixed with, and thus disposed throughout, the elastomeric polymer matrix 105, the composite material 100 is uniform. Put another way, the composite material 100, and thus the strain gauge, does not have layers and its composition is generally consistent at a macroscopic (e.g., naked eye) level from outer surface (outer wall) to outer surface. The composite material 100 may also have isotropic properties at a macroscopic level in that it does not exhibit a preferred directionality. For example, the conductive material 100 may exhibit piezoelectric response or piezoresistivity along the x-axis, the y-axis, and the z-axis, which are illustrated in FIG. 1A. In other words, the composite material 100 may exhibit piezoelectric response or piezoresistivity detectable from one outer surface of the material to another outer surface, regardless of which outer surfaces are used. As illustrated in FIG. 1A, the conductive nanoparticles 110 and the conductive stabilizers 115 may not be easily visible without magnification, such as magnification areas 150 and 160. At a microscopic level, e.g., illustrated by magnification areas 150 and 160, the components of the composite material 100 may be distinguishable, but may be generally dispersed in a consistent or even manner along any axis. Thus, while not exactly the same, the general composition of areas 150 and 160 are similar even at the microscopic level.

Due to the inclusion of conductive fillers, such as conductive nanoparticles 110 and/or conductive stabilizers 115, the composite material 100 exhibits negative piezoresistivity and a piezoelectric response to an impact or other deformation applied along any axis, such as the x axis, the y axis, and the z axis. Put another way, the measured electrical response is consistent in any direction over a same distance. For example, if an electrical response is detected along a first axis, a same distance is any distance within a sphere where the first axis is the diameter. Thus, when used as a strain gauge, composite material 100 is not limited to measuring impacts that arrive from a predetermined orientation with respect to the composite material 100. A material that exhibits a piezoresistive effect changes electrical resistance when compressed. A gauge with a negative piezoresistive effect becomes less resistant with increased strain, meaning a current will flow more easily through the material when compressed than through the material in its resting state. On the other hand, a gauge with a positive piezoresistive effect becomes more resistant with increased strain, meaning a current will not flow as easily. Traditional strain gauges measure strain by utilizing positive piezoresistivity; i.e., the electrical resistance increases with increased strain. The increased resistance in traditional strain gauges occurs due to Poisson-thinning of the strain gauge material. When a current producing device, such as a battery, is operatively coupled to the material, a change in the current may be measured as the material undergoes deformation. A sensor with a negative piezoresistive effect may be desirable for many applications since it will draw little or no current when the material is not strained, potentially prolonging the service time for battery powered applications. The change in electrical resistance is one type of electrical response to impact.

On the other hand, a material that produces a piezoelectric response generates electric potential, in the form of a voltage that can be measured. Thus, a material that produces a piezoelectric response may generate a voltage that can be measured without the need for an external current producing device. The voltage generated is another type of electrical response to impact. A material that exhibits a piezoresistive effect does not automatically produce a piezoelectric response and vice versa.

The composite material 100 is capable of being sculpted in any direction without affecting the piezoelectric response or the piezoresistive effect of the composite material because it is uniform between outer walls. In other words, because the composite material 100 does not include layers, it may be cast and then cut or sculpted in any direction without affecting its ability to act as a piezoelectric or piezoresistive sensor. Thus, for example, a large sheet or block of the material may be manufactured and many sensors cut from the same sheet. Moreover, the composite material 100, once cured, does not need to be charged; the piezoelectric response is inherent in the composite material 100 itself.

Due to the elasticity of the matrix 105, the composite material 100 is able to measure 80% strain without permanent deformation. In contrast, the most commonly used strain sensors, metal foil tensile strain gauges, can only measure small strains, up to approximately 5% strain, being limited by the yield point of the metallic materials used in the gauge. For example, nickel alloy foil gauges will permanently deform when strained over 7%, destroying the gauge. Unlike traditional metal foil strain gauges, the composite material 100 can be easily used in biological settings, which routinely experience strains on the order of 5% to 40%. The composite material differentiates itself from recently developed High Deflection Strain Gauges (HDSGs) that are able to provide accurate readings of strain up to 40% by measuring a piezoresistive response to tensile strain. The HDSGs have been successfully applied to a variety of bio-mechanical situations, but are configured specifically to quantify tensile strains, not compression strains. This limits their usefulness because in many biological settings it is important to quantify compression or impact strains.

Figure 1B:
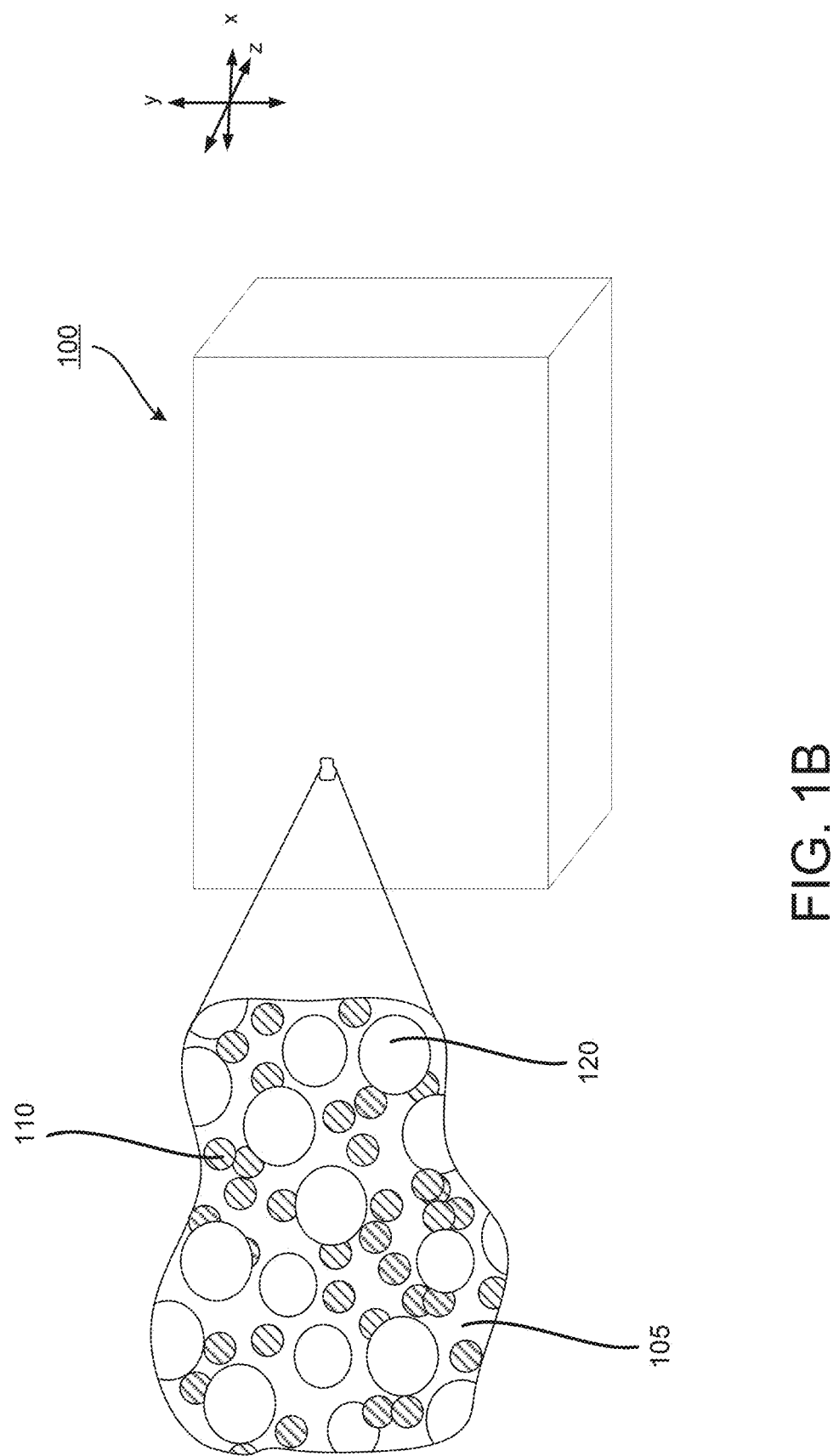
Figure 1C:
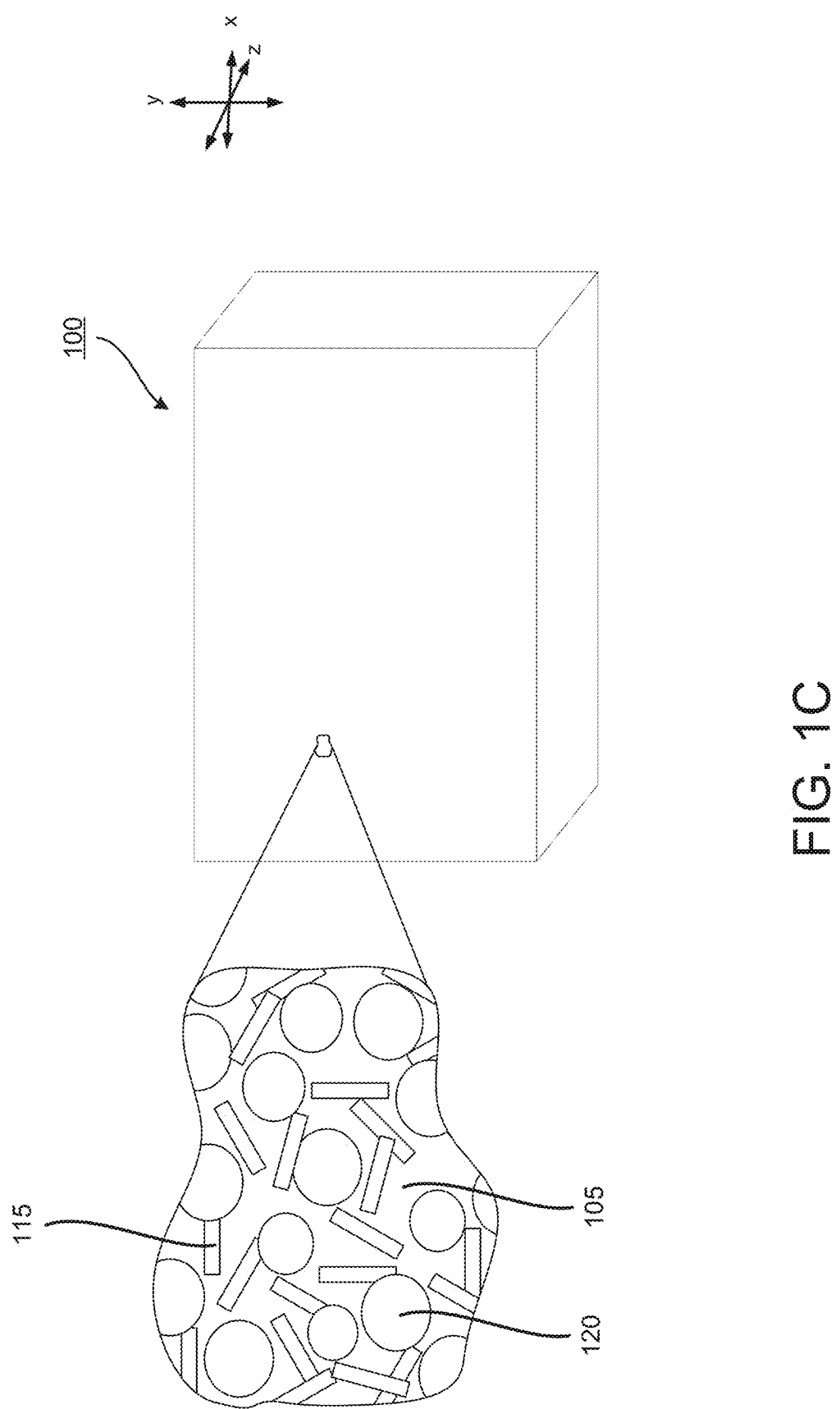
Figure 1D:
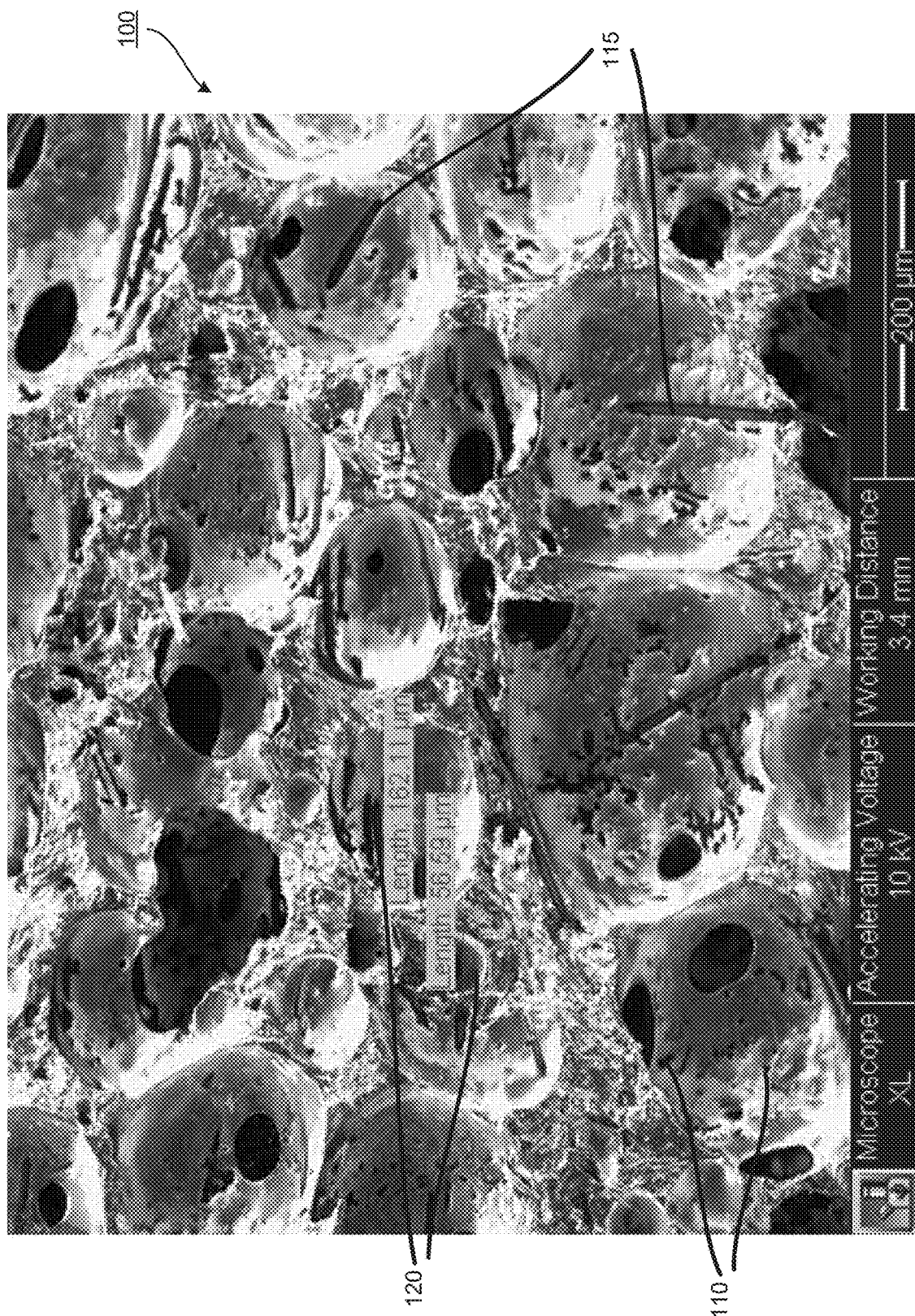
FIGS. 1D and 1E are microscopic images of a uniform composite material that functions as a strain gauge, according to an implementation.
Figure 1E:
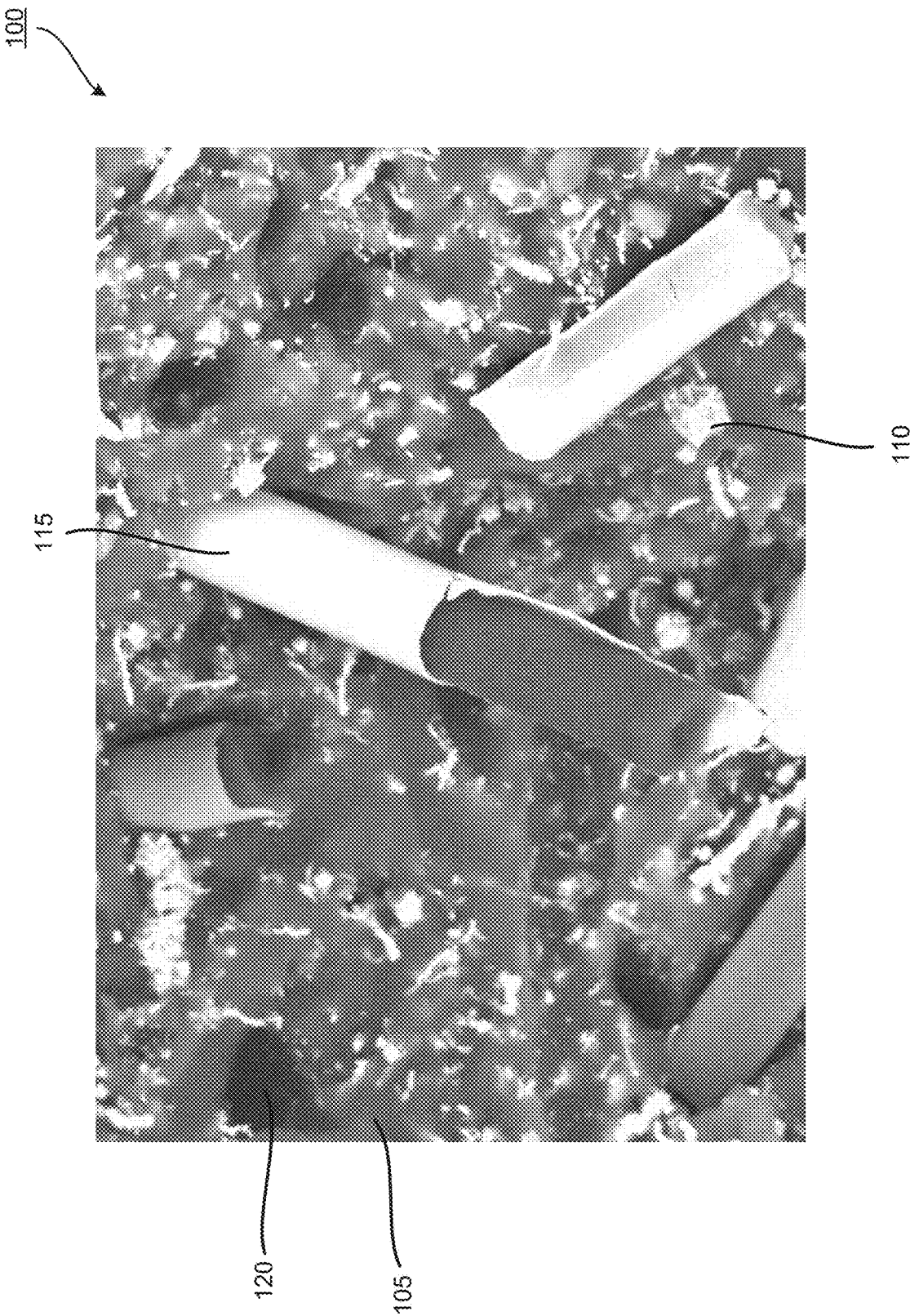

FIGS. 1D and 1E are images of an example composite material 100 taken with an electron microscope. Image 1D illustrates a composite material 100 with voids 120 of varying size. Also illustrated in FIG. 1D are example conductive stabilizers 115 and conductive nanoparticles 110. In the example of FIG. 1D, the elastomeric polymer is a silicone foam with fairly large, open-celled, voids 120. Voids 120 in a silicone foam may average 10 µm to 500 µm. Image 1E is a view of an example composite material 100 taken at higher magnification. Image 1E illustrates how the conductive nanoparticles 110 may be evenly dispersed and disposed through the matrix 105. Image 1E also illustrates that the size of the conductive stabilizers 115 is much larger (e.g., orders of magnitude larger) than the conductive nanoparticles. The elastomeric polymer in the example of FIG. 1E is a urethane foam with the same conductive fillers used in the example of FIG. 1D, but with fewer voids 120. Voids in urethane foam may average between 80 µm and 300 µm. Thus, as illustrated by FIGS. 1D and 1E, the composite material 100 may have varying amounts and sizes of voids depending on the formulation of the material, how material is mixed, formed, and/or cured.

Implementations are not limited to a composite material 100 that includes both conductive nanoparticles 110 and conductive stabilizers 115. FIG. 1B illustrates an implementation of composite material 100 that includes the elastomeric polymer matrix 105, voids 120, and the conductive nanoparticles 110 as the conductive filler without the conductive stabilizer. FIG. 1C illustrates another implementation of composite material 100 that includes the elastomeric polymer matrix 105, the voids 120, and the conductive stabilizers 115 as the conductive filler without the conductive nanoparticles. The variations of composite material 100 illustrated in FIGS. 1A through 1C all exhibit a piezoelectric response and have negative piezoresistivity. The amounts and types of conductive fillers used affect the amount of energy absorption of the composite material 100, the cost of the composite material 100, the strength of the piezoresistive effect, the strength of the piezoelectric response, etc. It is recognized that the amounts and ratios may be dependent on many factors, such as the function of the composite material as padding or protection, the desired cost, the anticipated amplitude of impacts, etc.

Figure 2:
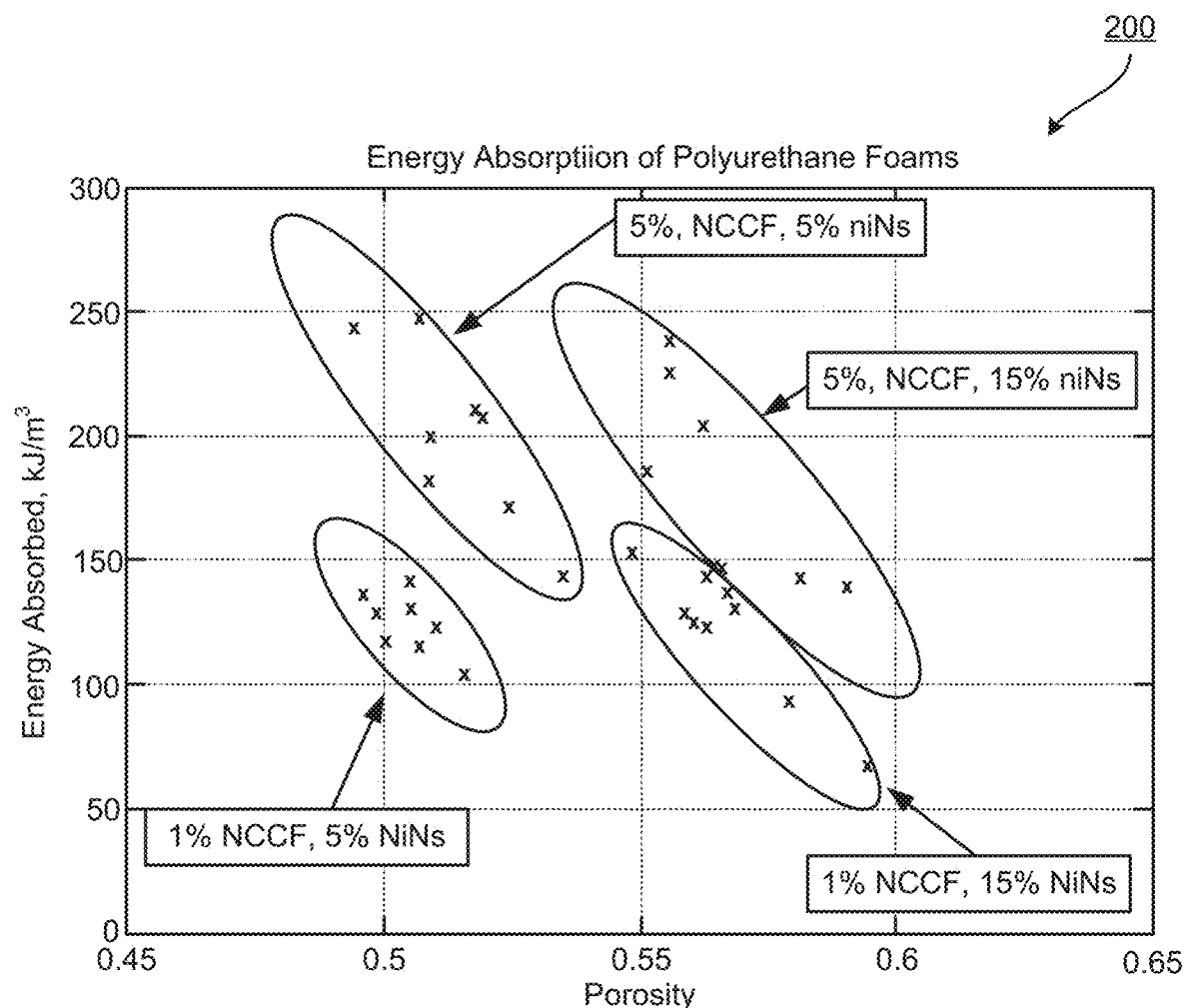
FIG. 2 is a graph illustrating energy absorption values and percent air by volume for polyurethane foams mixed with varying amounts of conductive fillers.

FIG. 2 is a graph 200 illustrating how varying portions of conductive fillers may result in variations in energy absorption among composite materials. In the example of FIG. 2, the matrix 105 is a polyurethane foam with various concentrations of conductive fillers disposed therein. The conductive fillers disposed in the polyurethane foam of FIG. 2 are Nickel Nanostrands (NiNs) and nickel-coated carbon fibers (NCCFs). Table 1 below illustrates sample compositions used to generate graph 200.

TABLE 1

| Sample | Weight(g) | Porosity (% Air) | Conductive Filler (% Weight) |
| --- | --- | --- | --- |
| 1 | 14.35 | 59.16 | 12.0 |
| 2 | 15.39 | 56.20 | 12.0 |
| 3 | 17.47 | 55.13 | 22.0 |
| 4 | 17.32 | 55.51 | 22.0 |
| 5 | 17.48 | 55.10 | 17.0 |
| 6 | 16.92 | 56.54 | 17.0 |
| 7 | 17.14 | 53.23 | 12.0 |
| 8 | 17.75 | 51.57 | 12.0 |
| 9 | 15.01 | 59.04 | 17.0 |
| 10 | 13.99 | 61.83 | 17.0 |

As illustrated in graph 200, mixing a higher concentration of conductive nanoparticles 110 (e.g., the NiNs) with the polyurethane foam prior to curing may result in a higher volume fraction of air, which is one component of porosity, of the composite material 100. A higher concentration of conductive stabilizers 115 (e.g., the NCCFs), may result in higher energy absorption. Graph 200 illustrates how varying amounts of conductive nanoparticles 110 and conductive stabilizers 115 may affect the properties of the composite material 100. Of course, the compositions used in Table 1 and graph 200 are provided as examples only and implementations are not limited to the amounts, compositions, or component materials used to generate graph 200.

Differing the amount and types of conductive fillers may also affect the piezoelectric response and the piezoresistivity of the composite material. For example, when the conductive fillers create a continuous conductive path (a percolating network) of conductive particles and nano-scale junctions between those particles, the composite material 100 may exhibit better (e.g., more pronounced) piezoresistivity, in the form of a decrease in electrical resistance with increased strain. When the conductive fillers do not form a continuous path (e.g. for charge dissipation), the composite material 100 may exhibit better or more pronounced piezoelectric responses.

Figure 3A:
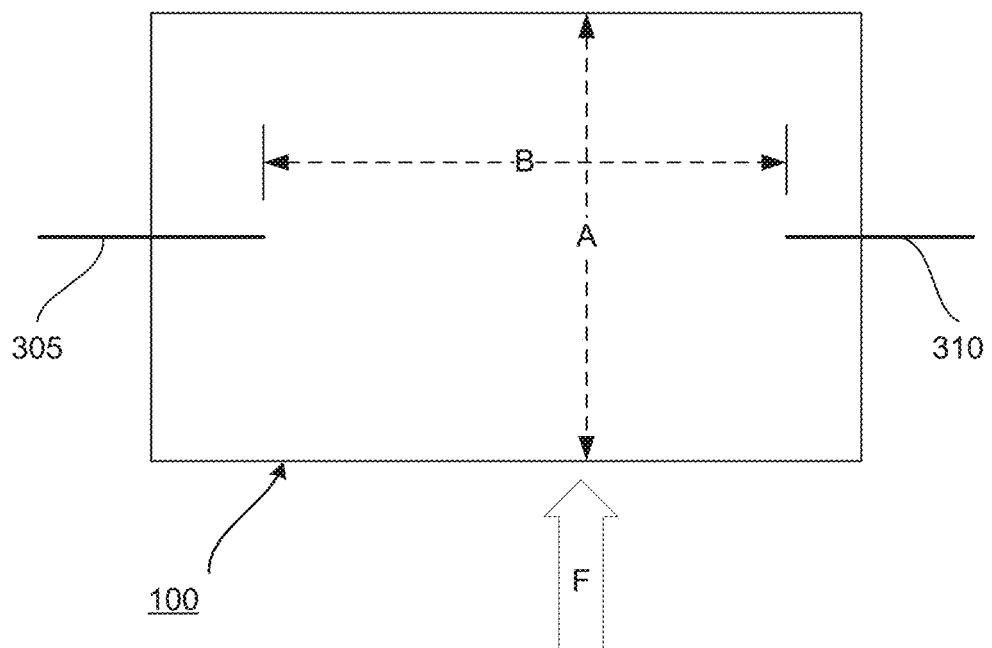
FIGS. 3A through 3C are schematic diagrams of a piezoelectric strain gauge, according to an implementation.
Figure 3B:
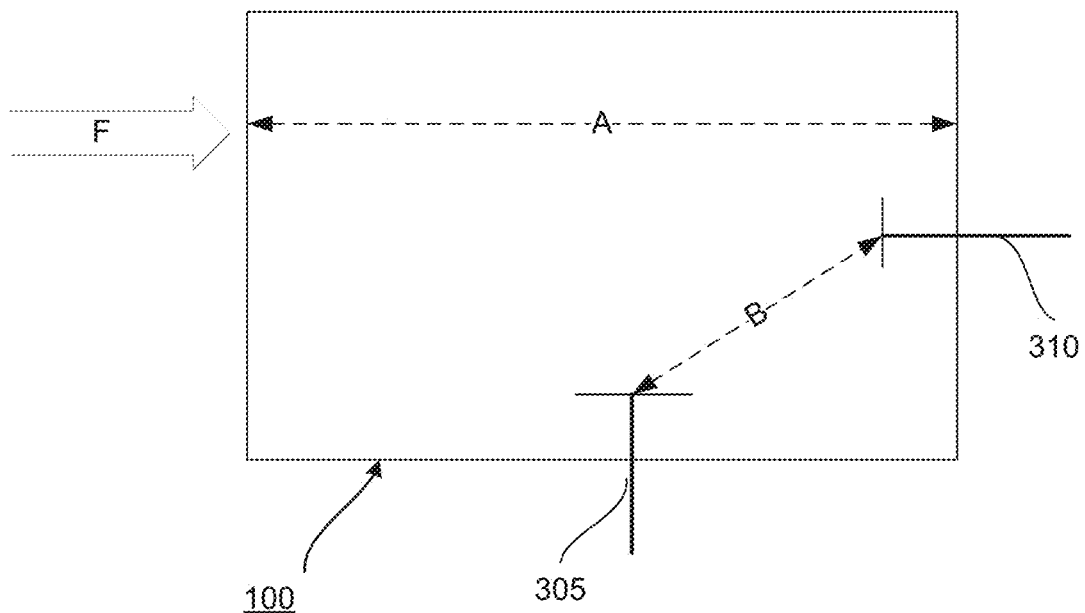

FIG. 3A is a schematic diagram of a piezoelectric strain gauge, according to an implementation. The strain gauge of FIG. 3A includes the composite material 100 with two probes 305 and 310 disposed in the composite material 100. The probes may be wires, wires with a mesh screen attached, or another form of conductive material. The probes 305 and 310 may be cast in the composite material 100 prior to curing or may be inserted or disposed into the composite material 100 after curing. At least a portion of the probes 305 and 310 may extend beyond an outer-wall of the composite material 100. The portion that extends beyond the outer-wall may be operably coupled to a voltage detector (not shown). The probes 305 and 310 may be used, when operably coupled to one or more voltage detectors, to detect a voltage increase due to a piezoelectric response to an impact, labeled as "F" in FIG. 3A. As illustrated in FIG. 3A, the impact F may be along a first axis A. The impact F may cause the composite material 100 to produce a piezoelectric response, in the form of a voltage increase that may be detected using one or more of probes 305 and 310 along axis B. As illustrated in FIG. 3A, the composite material 100 produces a voltage detectable along an axis B that differs from the axis A associated with the impact F. Thus, FIG. 3A illustrates that detecting the piezoelectric response in the composite material 100 is independent of the direction (or axis) of the impact. FIG. 3B further illustrates that the probes 305 and 310 need not be along a horizontal or vertical axis. Instead, the probes may be located anywhere along the outer-wall of composite material 100 and still used to detect a voltage generated in response to the impact F. Of course, probes may also be disposed or inserted into the interior of composite material 100.

Figure 3C:
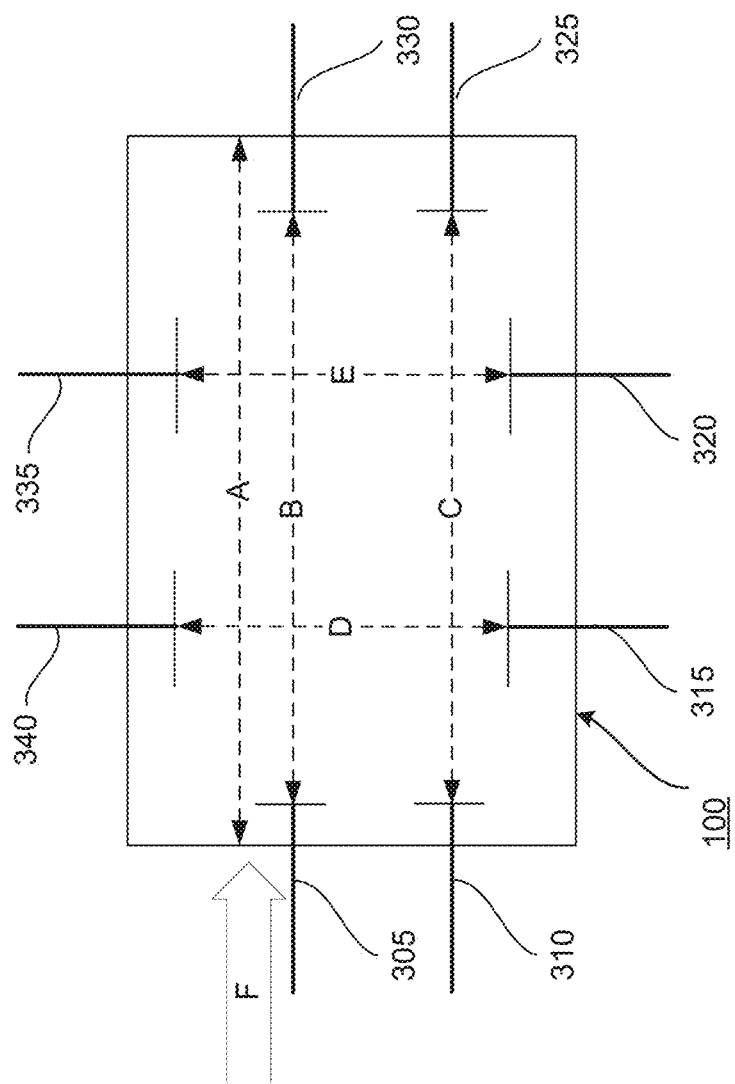

FIG. 3C is a schematic diagram of a piezoelectric strain gauge that can produce data used to determine a location of the impact F in addition to the deformation of the impact F. In FIG. 3C, the strain gauge includes the composite material 100 and a plurality of probes, 305 through 340, arranged in a lattice or grid. The lattice or grid can be irregular (e.g. need not be orthogonal or evenly spaced) and may have a random, but known, arrangement. Each of the probes in the lattice or grid, (e.g., probes 305 through 340) may be used to detect a voltage generated in response to impact F. Probes closer to the impact site, for example probes 305 and 340, may measure a higher voltage than probes further from the impact site. Although the differences may be slight, they can be used to approximate where at the outer-wall of the composite material 100 the impact occurred.

While the examples of FIGS. 3A-3C discuss detection of a piezoelectric response, it is understood that the examples apply equally to the detection of a piezoresistive effect of the composite material as well. In other words, the probes may detect a change in the electrical resistance of the composite material 100, rather than a generated voltage. Similarly, implementations are not limited to configurations with the illustrated probe locations.

Figure 4:
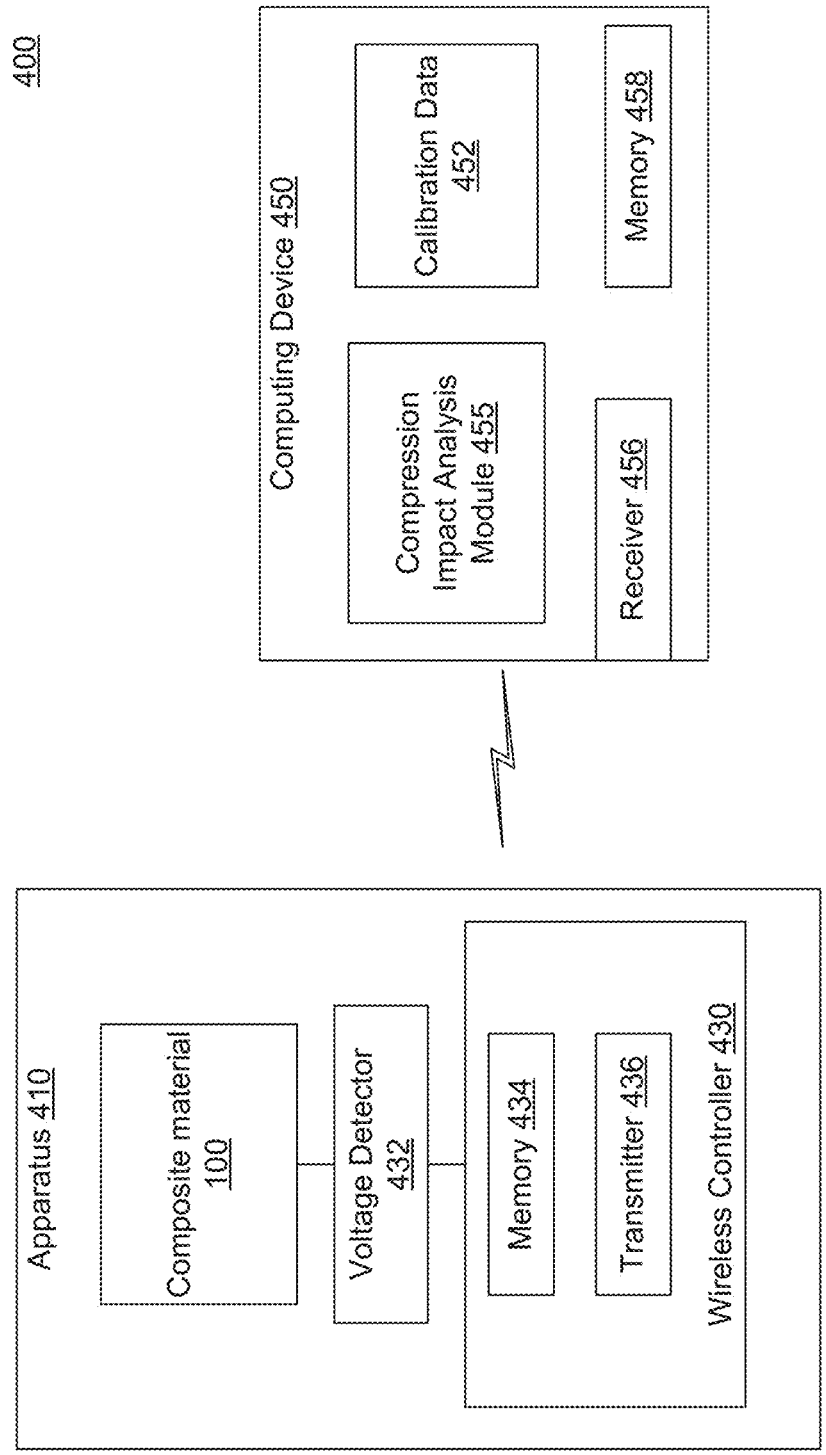
FIG. 4 is a high-level block diagram that illustrates an example of a system that uses a piezoelectric strain gauge, according to an implementation.

FIG. 4 is a high-level block diagram that illustrates an example of a system 400 that uses a piezoelectric strain gauge, according to an implementation. The system may include apparatus 410. Apparatus 410 may include the composite material 100 that includes an elastomeric polymer matrix, voids, and conductive fillers. The composite material 100 may be composite material 100 described with respect to FIGS. 1A through 1E. The apparatus 410 may include a voltage detector 432 operatively coupled to the composite material 100. In some implementations, the voltage detector 432 may be coupled to the composite material 100 via one or more probes disposed in the composite material 100. In some implementations the apparatus 410 may include a plurality of voltage detectors 432, each operatively coupled to the composite material 100, for example via a plurality of probes. The voltage detector 432 may be capable of detecting voltage generated by the composite material 100 when the composite material 100 experiences strain, for example due to an impact. The voltage detector 432 may also be capable of detecting a decrease in electrical resistance when the composite material 100 experiences strain, for example due to an impact. The voltage detector 432 may be any device that detects or uses voltage, including, for example, a light that lights up when voltage is detected or produces a value that can be stored. In some implementations, the voltage detector 432 may also include other components (not shown), such as memory and/or a processor, (e.g., a processor formed in a substrate).

The voltage detector 432 may be operatively coupled to a memory 434 and/or a transmitter 436. The memory 434 may be any type of volatile or non-volatile memory capable of storing data. In some implementations, the voltage detector 432 may be capable of converting detected voltage into a value that is stored in the memory 434. In some implementations the memory 434 may be a component of the voltage detector 432. In some implementations, the memory 434 may store additional information with the voltage value, such as the date and/or time the value was detected. In some implementations, with multiple voltage detectors 432, the additional information may include an identifier of the voltage detector that detected the value. The memory 434 may also store other information with the voltage value. The voltage value and additional information, if any, are considered voltage data. Thus, the memory 434 may store voltage data detected after a strain event, such as an impact received by the composite material 100. In some implementations, the memory 434 may store a plurality of voltage data, representing a plurality of strain events. The memory 434 may store the plurality of voltage data until it is transmitted to a computing device, either wirelessly or via a wired connection.

In some implementations, the memory 434 may be operatively coupled to a transmitter 436. The transmitter 436 may be capable of transmitting data wirelessly, or transmitting data via a wired connection, such as a Universal Serial Bus (USB) cable. In some implementations, the memory 434 and the transmitter 436 may be included in a wireless controller 430. The wireless controller 430 may be a wireless microcontroller, for example the Synapse SNAP. The wireless micro-controller may enable the apparatus 410 to have a small form-factor while still being able to transmit voltage data to a computing device with capacity to analyze the data. The small form factor of the voltage detector 432, the memory 434, and the transmitter 436 allow existing products to include the apparatus 410 without significant redesign. The small form-factor also results in an apparatus 410 that is highly portable, making it useful in many biological settings. This is a benefit over many currently available high strain sensors that are inadequate when measuring strain in biological settings because they can be cumbersome, challenging to calibrate, and are often expensive. In some implementations, the transmitter 436 may transmit the voltage data from the memory in response to a command from a computing device, such as computing device 450. In some implementations, the transmitter 436 may be configured to transmit the voltage data in response to the data being stored in the memory. In some implementations, the voltage detector 432 may be operatively coupled to the transmitter 436 and memory 434 may be optional. In such an implementation, the transmitter 436 may transmit the voltage data as soon as the transmitter 436 receives voltage data.

The transmitter 436 may transmit voltage data to a computing device 450. The computing device 450 may be an external computing device, separate from the apparatus 410. In such implementations, the computing device 450 may include a receiver 456. In some implementations, the computing device 450 may be incorporated into the apparatus 410. The computing device 450 may be any type of computing device, such as a controller (e.g., a processor, a microcontroller, etc.), a tablet, a laptop, a smart phone, a server, a television with a processor, etc. The computing device 450 may include a compression impact analysis module 455. The compression impact analysis module 455 may be configured to interpret the voltage data received from the apparatus 410. Interpreting the voltage data may include determining a deformation for the strain event, determining a series of deformations for a series of strain events, determining a strain rate, and/or providing an analysis of the deformation(s) and strain rates. For example, the compression impact analysis module 455 may have access to calibration data 452 that enables the compression impact analysis module 455 to convert the voltage value into a value representing the deformation experienced by the material 100 as a result of the impact. Deformation can represent compression strain (e.g., compression percent), tensile strain (e.g., stretch percent), or other strain (geometrical distortion) related to stress, force, amplitude, the impulse (e.g., force applied and the amount of time the force is applied), and/or the impact energy absorbed as a result of an impact event. In some implementations, the compression impact analysis module 455 may also be able to determine strain rate of an impact event. For example, if the composite material 100 undergoes a repeated impact having the same deformation, any changes in detected voltage may be due to different strain rates. For example, an impact with a known deformation produces more voltage when the impact occurs at a faster rate. In some implementations, the compression impact analysis module 455 may provide a user with the analysis, for example through a user interface (e.g., a report, a display, etc.).

The computing device 450 may also include a calibration data 452. The calibration data 452 may be used by the compression impact analysis module 455 to analyze and interpret the voltage data. In some implementations the calibration data 452 may be provided to the computing device 450. In some implementations, the computing device 450 may include a module (not shown) that collects and stores the calibration data 452. The calibration data 452 may represent the voltage values associated with impacts of known deformation and strain rate. Because the composition of the composite material 100, for example the amount of conductive nanoparticles and the amount of conductive stabilizers, can affect the piezoresistive and piezoelectric properties of the composite material 100, composite material 100 that is manufactured outside of a controlled environment (e.g., outside of an established manufacturing process) may need to be calibrated after each manufacture. Composite material 100 that is manufactured in a controlled environment, however, nay not need calibration after every manufacture.

In some implementations, the apparatus 410 may be embedded, inserted, implanted, or otherwise disposed in a helmet. In such an implementation, the composite material 100 may be disposed in the helmet as padding and function as protective padding as well as a compression strain gauge. The apparatus 410 disposed in a helmet may transmit voltage data to an external computing device 450 so that impacts received by the composite material 100 may be analyzed in real-time. This enables coaches and medical personnel, for example, to evaluate the risk of a concussion almost as soon as the impact happens. The apparatus 410 in a helmet may also store voltage data (or a plurality of voltage data) until an external computing device 450 requests the data. In this manner, for example, medical personnel could retrieve data after an accident, for example a bicycle accident, to evaluate the seriousness of any impacts received. In some implementations, the apparatus 410 may be disposed in other types of protective gear, such as boxing gloves, a fencing jacket, or other equipment, such as a punching bag, etc. The apparatus 410 may function in this equipment as protective padding as well while also providing information on the impacts received by the protective gear or other equipment.

In some implementations, the apparatus 410 may be disposed in a shoe. For example, the apparatus 410 may be a smart insole that can analyze an individual's gait in a natural environment outside of a controlled lab. The composite material 100 may thus function as a padded insert as well as a compression strain gauge. The apparatus 410 may provide feedback for orthopedic fittings, training and caloric output, etc. In such implementations, the apparatus 410 may store a plurality of voltage data, corresponding to respective impact events, that is transmitted at the request of a user, an external computer, etc.

In some implementations, the apparatus 410 may be disposed on a structure, such as an artificial limb. The composite material 100 may be used, for example, as a skin for prosthetics to give feeling to the user. For example, the impact event may be pressing of a prosthetic finger against a hard surface (a touch) and the apparatus 410 may provide feedback to the user's nerve receptors about the impact or touch. The structure may also be a robotic appendage and the composite material 100 may provide data to the robot about a touch in the same manner. In some implementations, the composite material 100 may be disposed on a handle, such as a tennis racket, a golf club, or baseball bat and apparatus 410 can be used to analyze the grip of the user.

In some implementations, the apparatus 410 may be included in a mattress. The composite material 100 may function as the mattress or a mattress pad as well as a strain gauge. The apparatus may detect locations of pressure and actuate a mechanism to reduce pressure in said location. The reduction in pressure points may reduce the frequency of bed sores without care givers interaction with patient. The apparatus 410 may thus enable the system to analyze motion movement as the user sleeps. The examples provided herein are not exhaustive and not intended to be limiting.

While FIG. 4 has been discussed with regard to compression strains, it is understood that the composite material 100 also exhibits piezoresistivity and piezoelectric response to tensile strains or other deformations. Thus, apparatus 410 may easily be adapted to detect and measure deformation, for example, in a bushing configuration where plates are pulled apart for part of a cycle. Accordingly, apparatus 410 is not limited to detecting and measuring compression strains.

Figure 5:
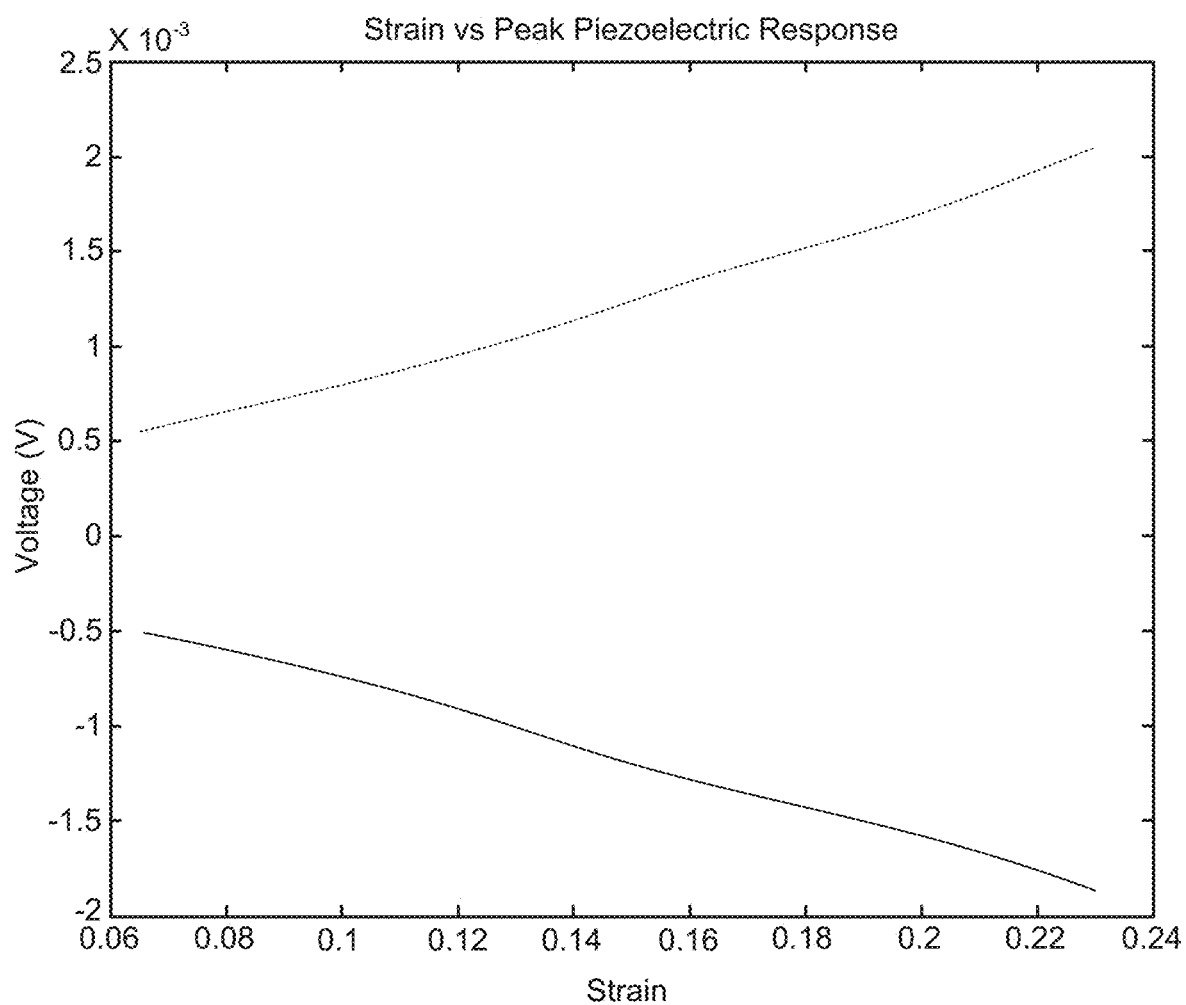
FIG. 5 is a graph illustrating the linear relationship between the piezoelectric response of one formulation of the composite material and amount of strain.

FIG. 5 is a graph illustrating the linear relationship between the piezoelectric response of an example of composite material 100 and deformation, or amount of strain. As the composite material is strained it generates a piezoelectric response that results in a voltage difference across a voltage detector. The response can be directly correlated to the amount of deformation the material experienced and is linear with respect to the deformation, as illustrated in the top line of FIG. 5. When the strain is released, the material generates a corresponding decrease in voltage response. These properties of the material allow calibration so that later strains can be measured with accuracy. It is understood that not all implementations of composite material 100 may exhibit a linear response. Some implementations may exhibit a non-linear response, but with proper calibration the response can be correlated to the amount of deformation the material experienced. In other words, the piezoelectric response varies with deformation in a manner than can be calibrated to determine the deformation of later impacts.

Figure 6:
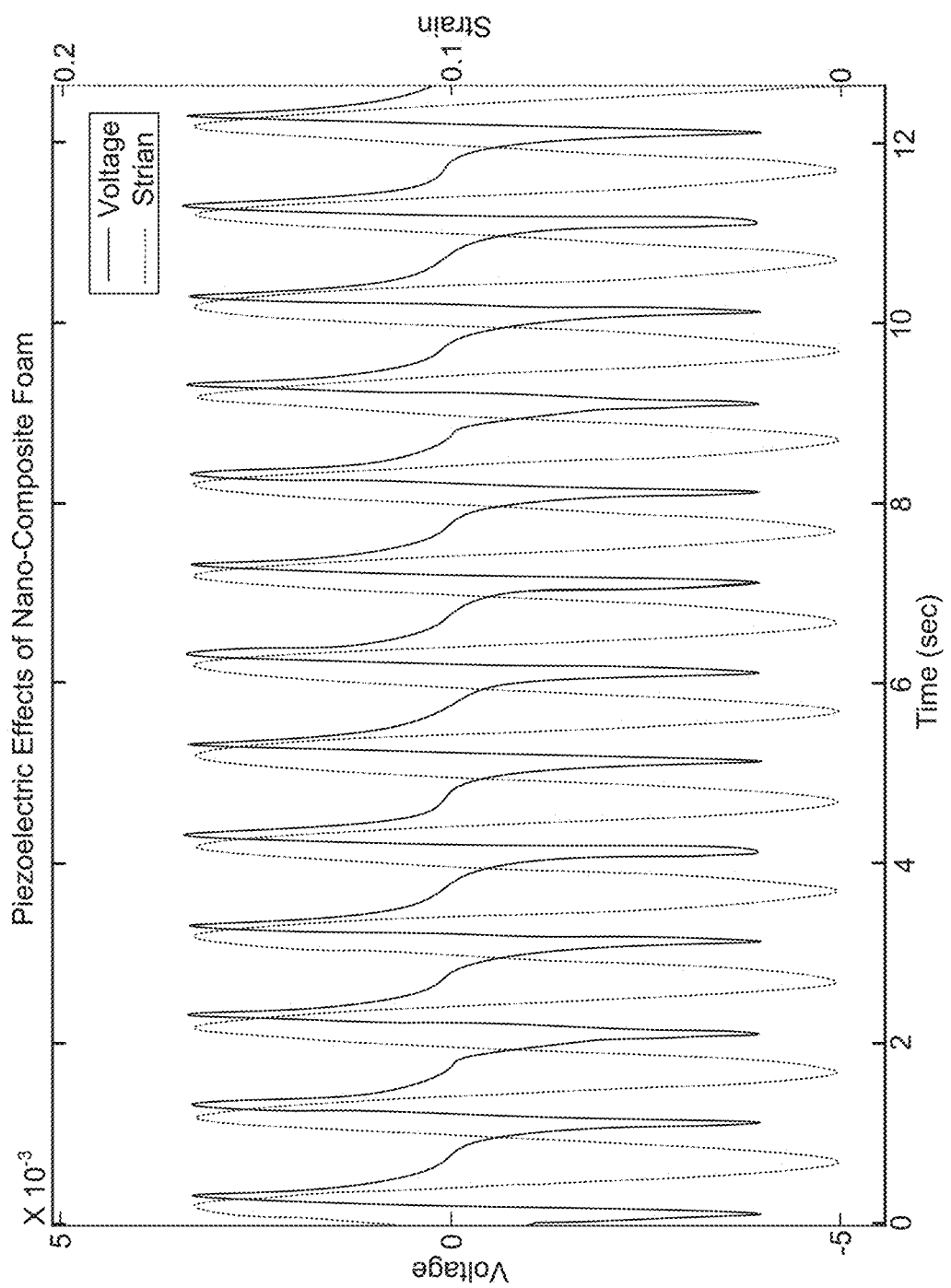
FIG. 6 is a graph illustrating the constancy of the voltage characteristics of the piezoelectric response of one formulation of the composite material through repeated strain events.

FIG. 6 is a graph illustrating the constancy (e.g. absence of drift) of the piezoelectric response of some implementations of the composite material through repeated impact events. FIG. 6 demonstrates that the piezoelectric response of some implementations of the composite material 100 is highly repeatable and does not drift with repeated cycles. Many piezoelectric sensors, including the HDSGs, suffer from drift, which affects the ability to accurately measure strain over extended periods of time. Drift occurs when the piezoelectric response or piezoresistivity of the gauge degrades over time with repeated strain events. For example, a sensor that suffers from drift may produce 1 amp in response to an impact with a force of 1 newton a first time, 0.9 amps in response to the 1 newton impact a second time, 0.8 amps in response to the 1 newton impact a third time, etc. Thus, the sensor fails to accurately measure the deformation of the impact over repeated cycles without recalibration. Unlike many piezoelectric and piezoresistive sensors, including HDSGs, FIG. 6 illustrates that the composite material 100 produces a consistent voltage in response to repeated strain events, which is ideal for many biological settings.

Figure 7:
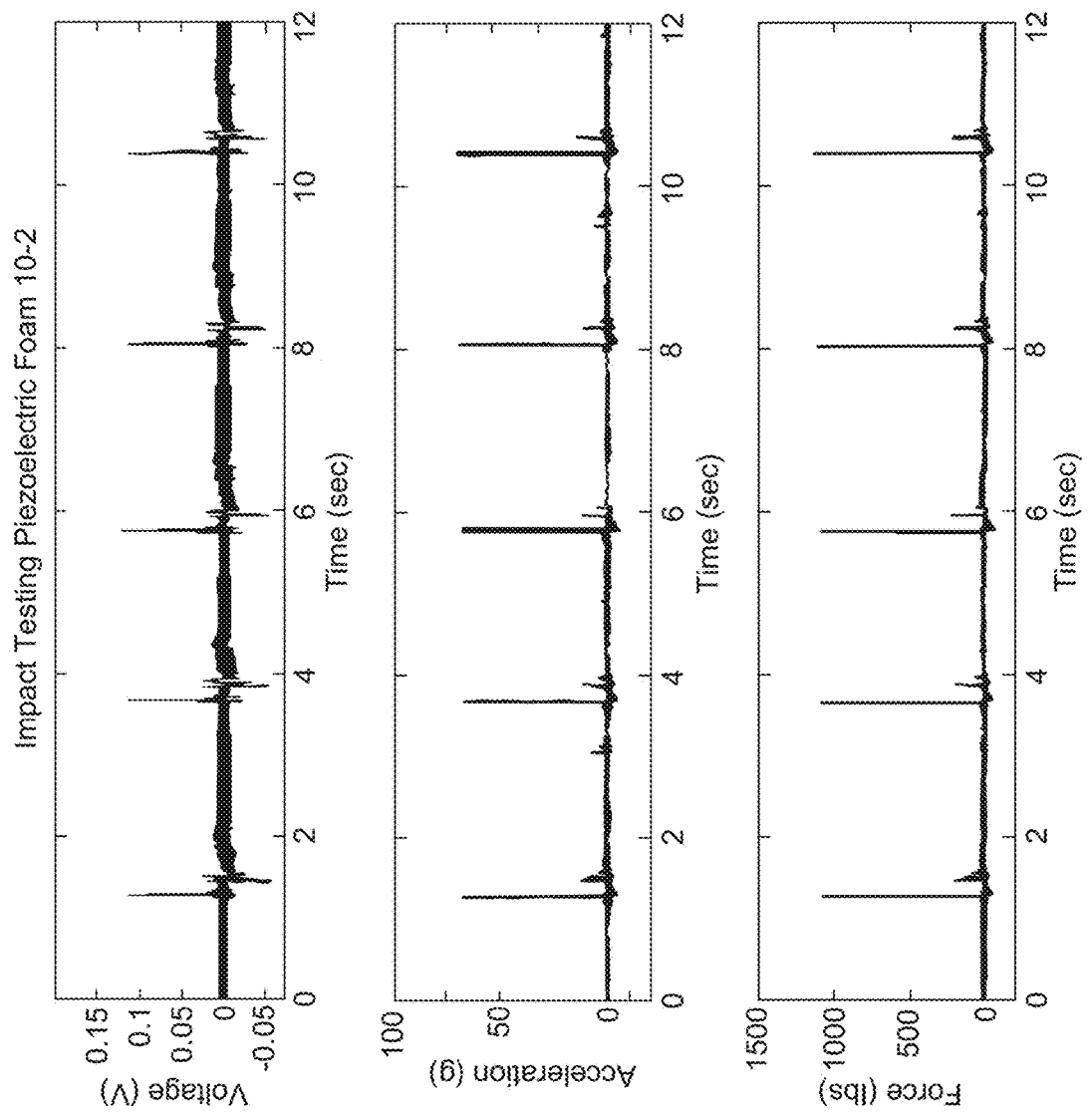
FIG. 7 is a graph illustrating the correlation between piezoelectrically induced voltage and measured force and acceleration under impact loading for one implementation of the composite material.

FIG. 7 is a graph illustrating the results from a drop test output performed on one implementation of the composite material. In the example of FIG. 7 a matrix was a polyurethane foam with approximately 3% conductive stabilizers and 10% conductive nanoparticles. A sliding hammer was instrumented with an accelerometer which would impact a piece of the composite material mounted atop a load cell. FIG. 7 shows that this sample of the composite material gave a consistent voltage response to each impact as characterized by the force and acceleration measured simultaneously. It is also shown that the example composite material exhibits a second response as the hammer is removed from the foam.

Figure 8:
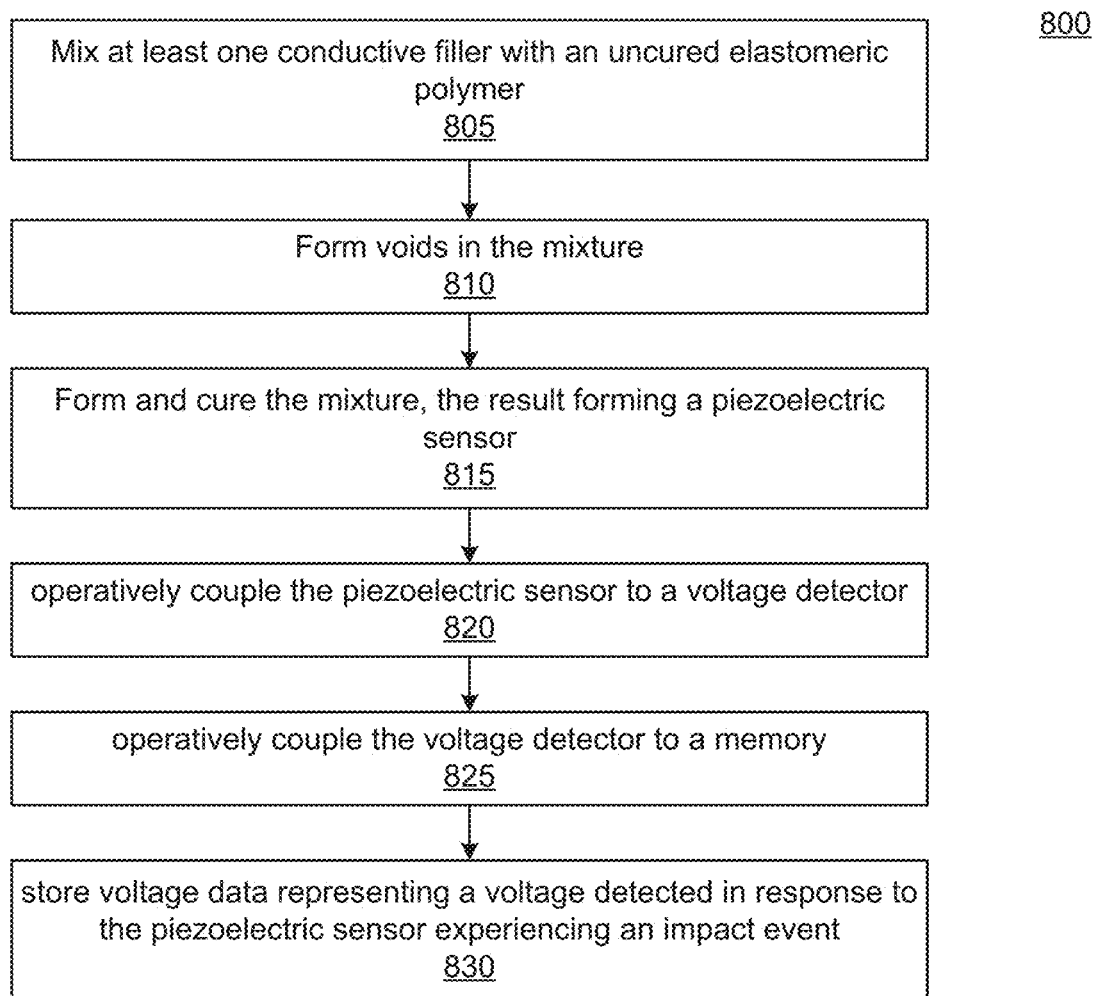
FIG. 8 is a flowchart that illustrates an example method for making a piezoelectric strain gauge, according to an implementation.

FIG. 8 is a flowchart that illustrates an example method 800 for making a piezoelectric strain gauge, according to an implementation. The method 800 produces a composite material and component parts that can be used as a piezoelectric or piezoresistive sensor for measuring compression strains at least up to 80% strain. At 805, at least one conductive filler is mixed with an uncured elastomeric polymer. As indicated above, the conductive filler may include conductive nanoparticles and/or conductive stabilizers. The ratio and amounts of conductive filler mixed with the uncured elastomeric polymer depends on the desired properties of the gauge. For example, if additional energy absorption or a stiffer foam is desired, more conductive stabilizers may be mixed with the uncured elastomeric polymer. If increased porosity is desired, e.g., for a material with more voids, although of smaller size, more conductive nanoparticles may be mixed with the elastomeric polymer because the increased nanoparticles increase the nucleation points, which increases the number of voids but may end up reducing the size of the voids. As discussed herein, the amount of conductive nanoparticles can affect the porosity of the material, the formation of nano-junctions, the formation of a conductive path, etc., which can affect the piezoelectric and piezoresistive effects.

At 810 voids are formed in the mixture. Voids may be formed as a result of a chemical reaction when two component parts of the elastomeric polymer are mixed. Voids may also be formed as a result of dispersion of a gas or introduction of a foaming agent. The voids may be formed as part of the curing process of the elastomeric polymer. The amount (volume fraction of air) and size of the voids determine the porosity of the material. The porosity of the material can affect the piezoelectric and piezoresistive responses observed in the composite material. For example, composite material with a polyurethane foam matrix that has approximately 40% to 80% volume fraction of air was found to produce acceptable piezoelectric responses, but above 80% volume fraction of air the piezoelectric response degraded. Similarly, suitable piezoelectric response has been observed in composite materials having voids ranging from 10 µm to 300 µm. The optimal porosity of the composite material used in a piezoelectric gauge may also be dependent on the type of matrix used and the purpose of the strain gauge. Moreover, by keeping the volume constant (e.g., by using a mold) while increasing the amount of material (e.g., by introducing more of the elastomeric polymer mixed with the conductive fillers into the mold), the size of the voids in the resulting composite material is decreased, causing a corresponding increase in Young's modulus. The modulus of the composite material can, therefore, be matched to existing foams, so that the composite material may be embedded into common objects, functioning as a strain gauge and gathering data in a normal physiological setting.

At 815 the mixture is formed, for example by casting, painting, spraying, extruding, or molding, and cured. Once formed and cured, the mixture is a composite material capable of acting as a piezoelectric sensor without further processing. In other words, the cured composite material does not need to be charged or have other materials or layers added to act as a sensor. Thus, the composite material is non-additive. While additional components, such as probes and a voltage detector, may be needed to detect the piezoelectric response, the composite material produces the response without additions. It is understood that in some implementations, steps 815 and 810 may be combined. In other words, the voids may develop while the mixture is formed and/or cured or as a result of the curing process.

At 820 the cured composite material, or the piezoelectric strain sensor, may be operatively coupled to a voltage detector. For example, the voltage detector may be coupled via one or more probes disposed in the material. The probes may be cast with the composite material or may be inserted after the composite material has cured. If the voltage detector does not include a memory, the voltage detector may also be operably coupled to a memory at 825. The memory may store voltage data that represents a voltage detected in response to an impact or other strain-inducing event. The voltage data may include a voltage value representing a voltage detected by the voltage detector and additional information, such as a date/time, a voltage detector identifier, etc. The voltage data may be transmitted to a computing device for analysis.

Figure 9:
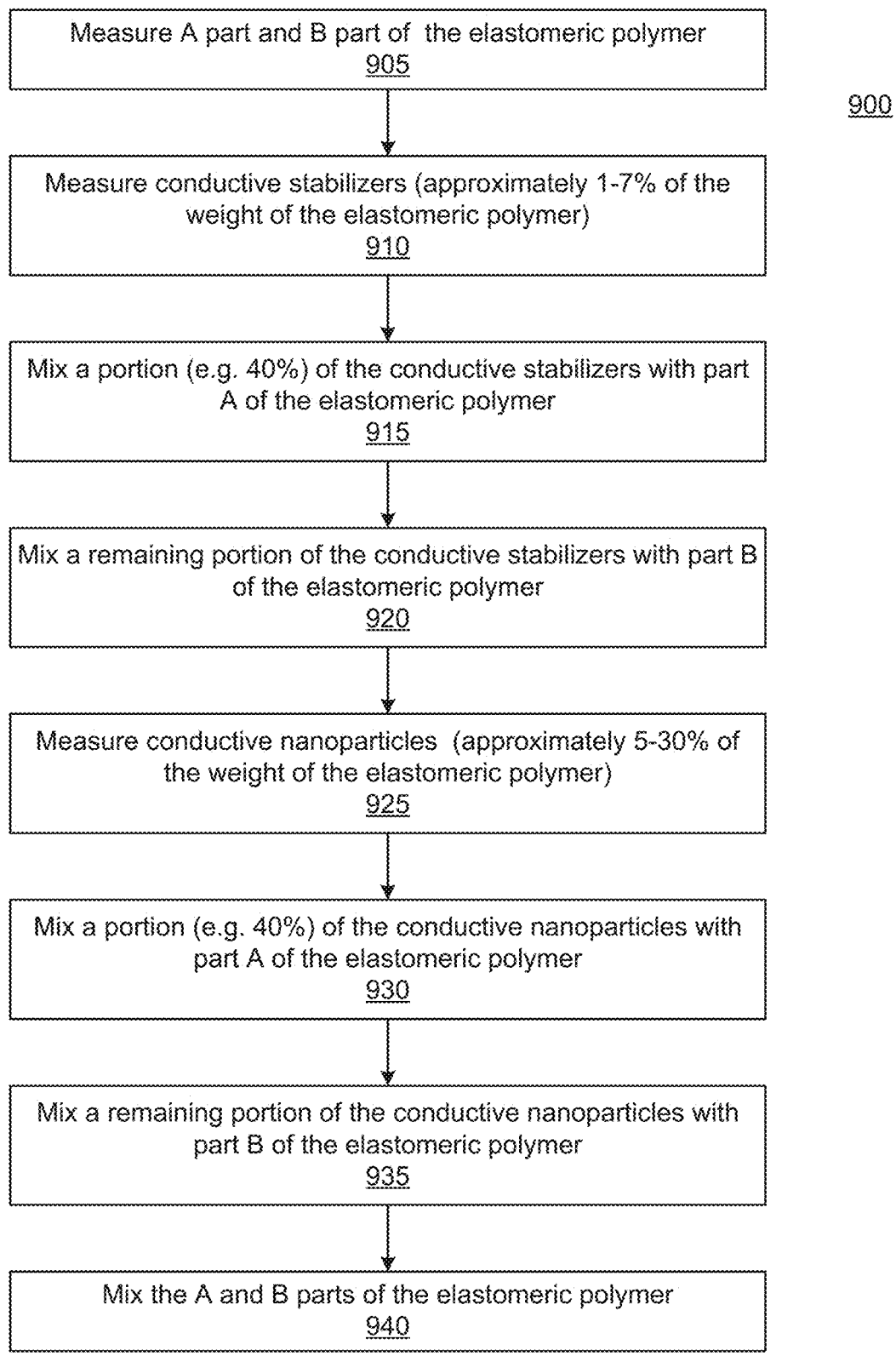
FIG. 9 is a flowchart that illustrates an example method for making a uniform composite material that functions as a strain gauge, according to an implementation.

FIG. 9 is a flowchart that illustrates an example process 900 for making a composite material that functions as a strain sensor, according to an implementation. Process 900 may be an example of mixing conductive fillers with the uncured elastomeric polymer as part of step 805 of FIG. 8. In the example of process 900, the conductive fillers include both conductive stabilizers and conductive nanoparticles and the uncured elastomeric polymer includes an A part and a B part that are kept separate until formation and curing. Examples of such an elastomeric polymer include, but are not limited to, silicone foams, polyurethane foams, latex foam, vinyl nitrile, etc. At 905 the desired amounts of parts A and B of the uncured elastomeric polymer are measured. At 910 the desired amount of conductive stabilizers, e.g., nickel-coated carbon fibers, are measured. In one implementation the amount of conductive stabilizers is approximately 1 to 7% of the weight of the elastomeric polymer. At 915 a portion of the measured conductive stabilizers are added to part A of the elastomeric polymer. The portion mixed with part A may be smaller than the portion mixed with part B of the elastomeric polymer. In some implementations, approximately 40% of the measured amount of the conductive stabilizers are added to part A and 60% are added to part B. In some implementations, the portion mixed with part A may be related to a ratio by weight of part A and part B. In some implementations, mixing may be accomplished, for example by stirring and/or via a specialized mixer, such as a centrifugal mixer. For example, the conductive stabilizers may be mixed with part A using a glass rod and then placed in a centrifugal mixer and mixed to ensure that the conductive stabilizer is thoroughly and evenly dispersed in part A. Mixing times may be dependent upon the elastomeric polymer used. For example, a silicone foam may be mixed for 10 seconds at 2000 rpm to allow time to introduce the foam into the mold, while urethane foam may be mixed for 20 seconds at 2000 rpm. The remaining portion of the conductive stabilizer may be mixed with part B of the uncured elastomeric polymer at step 920. The remaining portion may be mixed in the same manner as described with regard to step 915.

At step 925, the desired amount of conductive nanoparticles are measured. In some implementations, the weight of the measured conductive nanoparticles may be approximately 5 to 20% of the weight of the elastomeric polymer. In some implementations, the conductive nanoparticles may be screened prior to measuring. For example, the conductive nanoparticles may be pushed through or scraped over a mesh so that the measured conductive nanoparticles do not include large clumps. At 930, a portion of the measured conductive nanoparticles are mixed with part A of the uncured elastomeric polymer and at 935 the remaining portion is mixed with part B of the uncured elastomeric polymer. In some implementations, the portion of conductive nanoparticles mixed with part A is less than the portion mixed with part B, for example 40%. As with the conductive stabilizers, the conductive nanoparticles may be mixed using a centrifugal mixer to completely and evenly disperse the nanoparticles throughout the uncured elastomeric polymer.

At 940 part A and part B of the uncured elastomeric polymer may be mixed together. The parts may be mixed by stirring, by shaking, or by a specialized mixer, such as a centrifugal mixer. In some implementations, the parts may be mixed in the centrifugal mixer for 10 to 20 seconds at 2000 rpm, depending on the elastomeric polymer used. Once mixed, the composite material may be formed. For example, the composite material may be cast, molded, sprayed, painted, etc., and cured. For example, the elastomeric polymer may be poured into a heated mold for formation of the voids and curing. For example, in a two-part polymer, after the two parts are mixed together and poured into a mold, the elastomeric polymer may rise, due to formation of voids, and harden or cure in a heated mold. A heated mold may help the foam rise and may decrease the cure time, but the mold does not necessarily need to be heated. It is understood that the process 900 is an example method and that steps may be modified. For example, implementations may include mixing the conductive stabilizer with one part of the elastomeric polymer and the conductive nanoparticles with another part of the elastomeric polymer. Implementations may also include other variations.

Figure 10:
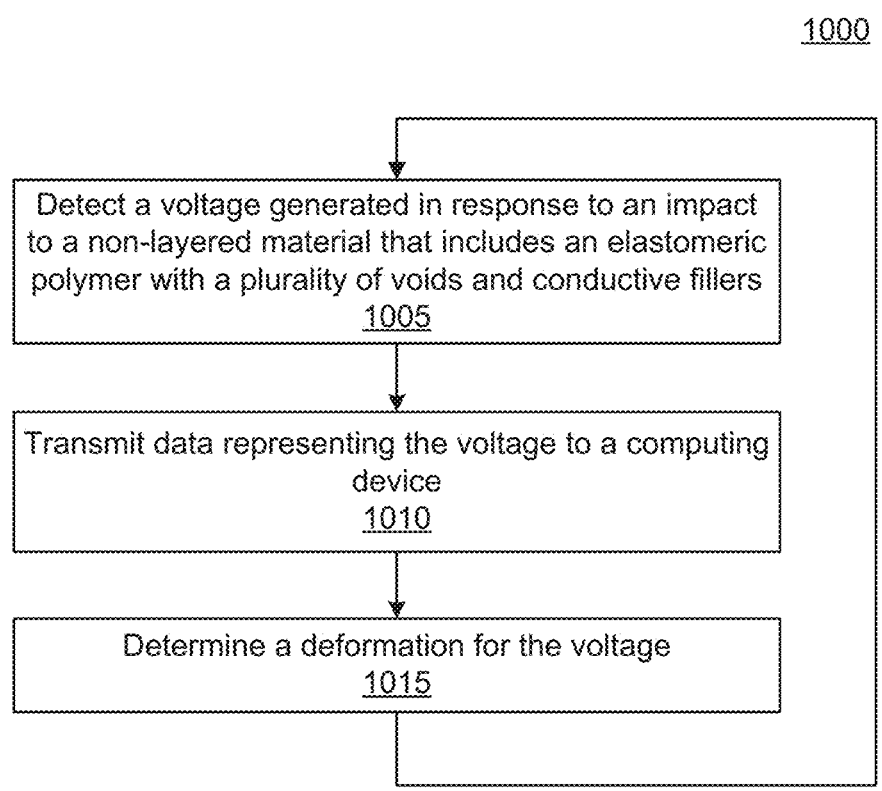
FIG. 10 is a flowchart that illustrates an example method for measuring a deformation using a uniform composite material that functions as a strain gauge, according to an implementation.

FIG. 10 is a flowchart that illustrates an example method 1000 for measuring a deformation using a composite material that functions as a strain gauge, according to an implementation. The method 1000 may be performed by a system that uses the composite material described above as a strain sensor. At 1005, a voltage detector may detect a voltage generated in response to an impact to a non-layered material that includes an elastomeric polymer with a plurality of voids and conductive fillers. The conductive fillers may include conductive nanoparticles, conductive stabilizers, or a combination of the two, as described above. The non-layered material is a composite material that is capable of generating a piezoelectric response upon curing, without charging, layering, or other added components. At 1010, the apparatus may transmit data representing the voltage to a computing device. The computing device may be an external computing device and the voltage data may be transmitted wirelessly. In some implementations, the computing device may be a microcontroller. In some implementations, the transmission may be wired, for example via a Universal Serial Bus connection between an apparatus that includes the strain sensor and a computing device. In some implementations, the data may be transmitted in response to detecting the voltage. In other words, the data may be transmitted in real-time. At 1015, the computing device may determine a deformation for the voltage. In some implementations, the deformation may represent an amount of energy absorbed. In some implementations, the deformation may represent an amplitude, an impulse, an impact energy, a strain, etc. The computing device may provide information about the deformation to a user.

Figure 11:
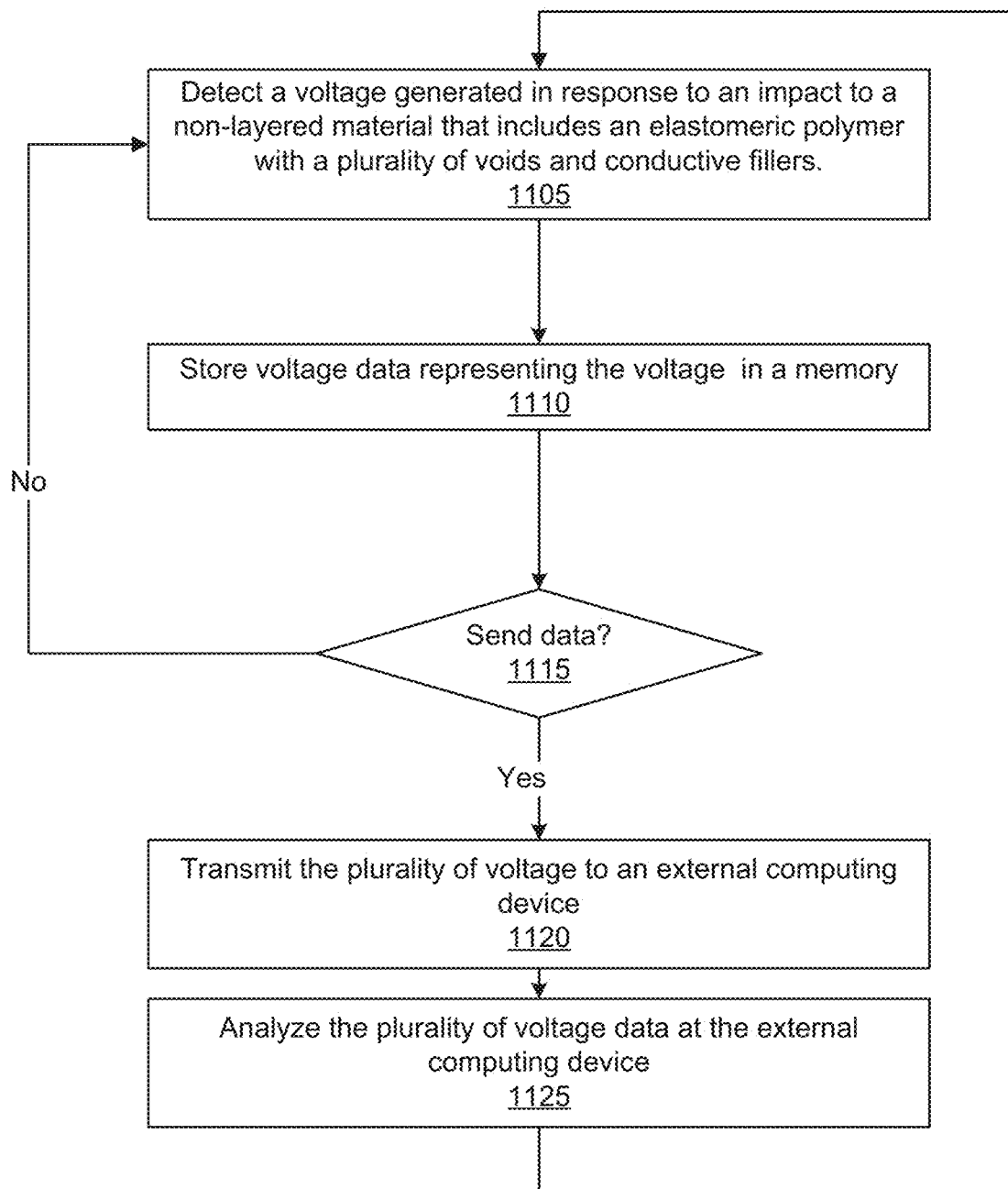
FIG. 11 is a flowchart that illustrates an example method for collecting voltage data for repeated impacts using a uniform composite material that functions as a strain gauge, according to an implementation.

FIG. 11 is a flowchart that illustrates an example method 1100 for collecting voltage data for repeated impacts using a composite material that exhibits a piezoelectric response, according to an implementation. The method 1100 may be performed by a system that includes the composite material as a strain sensor. At 1105, a voltage detector may detect a voltage generated in response to an impact to a non-layered material that includes an elastomeric polymer with a plurality of voids and conductive fillers. The conductive fillers may include conductive nanoparticles, conductive stabilizers, or a combination of the two, as described above. The non-layered material is a composite material that is capable of generating a piezoelectric response upon curing, without charging, layering, or other added components. The system may store voltage data representing the voltage in a memory at 1110. The data may include a value representing the voltage, a date and/or time the voltage was detected, an identifier of the voltage detector or a probe used to detect the voltage, etc.

The system may then determine whether to send the data at 1115. In some implementations, the system may send the data as soon as it is stored. In some implementations, the system may wait for a request for the data, for example a request initiated by a user or an external computing device. If the system determines the data is not to be sent (1115, No), the system may continue to monitor for impact events and store voltage data for detected events. If the system determines the data is to be sent (1115, Yes), the system may transmit the plurality of voltage data to an external computing device at 1120. In some implementations, once data is transmitted the data may be deleted from the memory. At the computing device, the system may analyze the plurality of voltage data to determine a deformation and, optionally, a strain rate, for the impact events represented by the data. The analysis may include generating graphs, charts, or reports provided to a user, for example via a display or a printer. It is understood that the data may be used in a variety of ways, depending on the type product the strain gauge is used in. For example, the data may be used in gait analysis, orthotic customization, injury assessment, grip analysis, touch feedback, motion movement analysis, early-warning crash detection (e.g., a car bumper), weight sensitive switching (e.g., a weight sensitive material for enabling or disabling automotive airbags). The sensor can also be embedded into the cars dash and door pads to enable impact detection for first responders assessment of accidents.

Referring back to FIG. 4, in some implementations, the system 400 and computing device 450 can be, for example, a wired device and/or a wireless device (e.g., Wi-Fi, ZigBee or BLUETOOTH enabled device) and can be, for example, a computing entity (e.g., a personal computing device), a server device (e.g., a web server), a mobile phone, a touchscreen device, a personal digital assistant (PDA), a laptop, a television including, or associated with, one or more processors, a tablet device, an e-reader, and/or so forth. The computing device 450 can be configured to operate based on one or more platforms (e.g., one or more similar or different platforms) that can include one or more types of hardware, software, firmware, operating systems, runtime libraries, and/or so forth.

The components (e.g., modules, processors) of the computing device 450 can be configured to operate based on one or more platforms (e.g., one or more similar or different platforms) that can include one or more types of hardware, software, firmware, operating systems, runtime libraries, and/or so forth. In some implementations, the components of the computing device 450 can be configured to operate within a cluster of devices (e.g., a server farm). In such an implementation, the functionality and processing of the components of the computing device 450 can be distributed to several devices of the cluster of devices.

The components of the computing device 450 (e.g., the compression impact analysis module 455 of the computing device 450) can be, or can include, any type of hardware and/or software configured to analyze voltage data. For example, in some implementations, one or more portions of the compression impact analysis module 455 in FIG. 4 can be, or can include, a hardware-based module (e.g., a digital signal processor (DSP), a field programmable gate array (FPGA), a memory), a firmware module, and/or a software-based module (e.g., a module of computer code, a set of computer-readable instructions that can be executed at a computer). For example, in some implementations, one or more portions of the components of the computing device 450 can be, or can include, a software module configured for execution by at least one processor (not shown). In some implementations, the functionality of the components can be included in different modules and/or different components than those shown in FIG. 4.

In some embodiments, one or more of the components of the computing device 450 can be, or can include, processors configured to process instructions stored in a memory. For example, the compression impact analysis module 455 (and/or portions thereof) can be, or can include, a combination of a processor and a memory configured to execute instructions related to a process to implement one or more functions.

Although not shown, in some implementations, the components of the computing device 450, such as the compression impact analysis module 455 of the computing device 450, can be configured to operate within, for example, a data center, a cloud computing environment, a computer system, one or more server/host devices, and/or so forth. In some implementations, the components of the computing device 450 can be configured to operate within a network. Thus, the components of the computing device 450 or apparatus 410 can be configured to function within various types of network environments that can include one or more devices and/or one or more server devices. For example, the network can be, or can include, a local area network (LAN), a wide area network (WAN), and/or so forth. The network can be, or can include, a wireless network and/or wireless network implemented using, for example, gateway devices, bridges, switches, and/or so forth. The network can include one or more segments and/or can have portions based on various protocols such as Internet Protocol (IP) and/or a proprietary protocol. The network can include at least a portion of the Internet.

In some implementations, the memory 434 and/or the memory 458 can be any type of memory such as a random-access memory, a disk drive memory, flash memory, and/or so forth. In some implementations, the memory 434 and/or the memory 458 can be implemented as more than one memory component (e.g., more than one RAM component or disk drive memory) associated with the components of the apparatus 410 or the computing device 450. In some embodiments, the calibration data 452 or the memory 458 (or a portion thereof) can be a remote database, a local database, a distributed database, a relational database, a hierarchical database, and/or so forth. As shown in FIG. 4, at least some portions of the calibration data 452 and/or transmitted voltage data can be stored in the memory 458 (e.g., local memory, remote memory) of the computing device 450. In some embodiments, the memory 458 can be, or can include, a memory shared by multiple devices such as computing device 450. In some implementations, the memory 458 can be associated with a server device (not shown) within a network and configured to serve the components of the computing device 450.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device (computer-readable medium) or in a propagated signal, for processing by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be processed on one computer or on multiple computers at one site or distributed across multiple sites and interconnected by a communication network.

Many of the method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the processing of a computer program include, by way of example, both general and special purpose microprocessors, and any one or more processors formed in a substrate of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT), liquid crystal display (LCD) monitor, or a touch screen for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
a uniform composite polymeric foam including a conductive fillers disposed therein, the uniform composite foam generating an electric potential, without an external current producing device, in response to being deformed;
at least one probe in contact with the uniform composite foam; and
a voltage detector coupled to the at least one probe.

2. The apparatus of claim 1, wherein the electric potential corresponds with a strain rate and deformation.

3. The apparatus of claim 1, further comprising:
a controller operably coupled to the voltage detector; and
memory storing instructions that, when executed by the controller, cause the controller to collect voltage data from the electric potential for a set of repeated impact events.

4. The apparatus of claim 3, further comprising:
a computing device operably coupled to the controller, the computing device configured to analyze the voltage data collected.

5. The apparatus of claim 1, wherein the conductive fillers are conductive stabilizers.

6. The apparatus of claim 1, wherein the conductive fillers in the uniform composite foam are disposed in an even manner from outer surface to outer surface.

7. The apparatus of claim 1, wherein the at least one probe is one of a plurality of probes disposed on the uniform composite foam in a pattern that enables sensing radii of adjacent probes to overlap.

8. An apparatus, comprising:
a material including a non-layered mixture of:
a polymeric foam, and
conductive fillers disposed in the polymeric foam;
at least two probes in contact with the material; and
a voltage detector coupled to at least one probe of the at least two probes,
wherein, the material exhibits a decrease in electrical resistance and generates an electric potential when deformed.

9. The apparatus of claim 8, wherein the apparatus comprises a plurality of regions of the material, each region of the plurality of regions being in contact with a respective probe, and the voltage detector being operably coupled to the respective probes.

10. The apparatus of claim 9, wherein the respective probes are disposed on the material in a pattern that enables sensing radii of adjacent probes to overlap.

11. The apparatus of claim 8, further comprising:
a current producing device connected to the voltage detector, wherein the voltage detector detects the decrease in electrical resistance and detects the electric potential generated.

12. The apparatus of claim 8, wherein the at least one probe is one of a plurality of probes disposed on the material in a pattern that enables sensing radii of adjacent probes to overlap.

13. An apparatus, comprising:
padding including a non-layered mixture of:
a polymeric foam, and
conductive fillers, the conductive fillers including conductive fibers;
at least one probe in contact with the padding; and
a voltage detector coupled to the at least one probe,
wherein, the padding exhibits a decrease in electrical resistance and generates an electric potential when deformed.

14. The apparatus of claim 13, wherein the apparatus comprises a plurality of regions of the padding, each region of the plurality of regions being in contact with a respective probe, and the voltage detector being operably coupled to the respective probes.

15. The apparatus of claim 13, wherein the conductive fillers are approximately one to twenty five percent by weight of the apparatus.

16. The apparatus of claim 15, wherein the conductive fillers are disposed in the polymeric foam in an even manner from outer surface to outer surface.

17. The apparatus of claim 13, wherein the decrease in electrical resistance and the electric potential generated are measurable over repeated deformation cycles without recalibration.

18. The apparatus of claim 13, wherein the apparatus further comprises:
a second probe in contact with the polymeric foam; and
a current producing device connected to the second probe,
wherein the voltage detector is configured to detect the decrease in electrical resistance and to detect the electric potential generated.

19. The apparatus of claim 18, wherein the at least one probe and the second probe are included in a plurality of probes disposed on the polymeric foam in a pattern that enables sensing radii of adjacent probes to overlap.

20. The apparatus of claim 13, wherein the electric potential is generated without a current producing device.

* * * * *